(12) United States Patent
Mitsuhira

(10) Patent No.: US 12,445,127 B2
(45) Date of Patent: Oct. 14, 2025

(54) DRIVE CIRCUIT

(71) Applicant: Kenji Mitsuhira, Tokyo (JP)

(72) Inventor: Kenji Mitsuhira, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 22 days.

(21) Appl. No.: 18/535,080

(22) Filed: Dec. 11, 2023

(65) Prior Publication Data

US 2024/0204776 A1   Jun. 20, 2024

(30) Foreign Application Priority Data

Dec. 16, 2022 (JP) ................. 2022-201512
Dec. 16, 2022 (JP) ................. 2022-201513

(51) Int. Cl.
*H03K 17/687* (2006.01)
*H02P 27/06* (2006.01)

(52) U.S. Cl.
CPC ......... *H03K 17/6871* (2013.01); *H02P 27/06* (2013.01); *H03K 2217/0063* (2013.01); *H03K 2217/0072* (2013.01)

(58) Field of Classification Search
CPC ....... H03K 17/6871; H03K 2217/0063; H03K 2217/0072; H02P 27/06
See application file for complete search history.

(56) References Cited

U.S. PATENT DOCUMENTS 9,294,084 B1    3/2016 McIntosh et al.
2019/0238129 A1*  8/2019 Fukushima ............. H02M 1/08

* cited by examiner

*Primary Examiner* — Lincoln D Donovan
*Assistant Examiner* — Amit R Bhatia
(74) *Attorney, Agent, or Firm* — IPUSA, PLLC

(57) ABSTRACT

The present disclosure provides a drive circuit whereby dead times and boost periods can be generated accurately. A drive circuit includes: a drive terminal; a first source current source to generate a first source current; a second source current source to generate a second source current; a first sink current source to generate a first sink current; a second sink current source to generate a second sink current; a logic circuit to generate a source drive command and a sink drive command in accordance with a clock; and a control circuit to generate a source boost signal and a sink boost signal in accordance with the clock.

9 Claims, 18 Drawing Sheets

FIG.5

|  | Source [mA] | Sink [mA] |
|---|---|---|
| SETTING 1 | 4 | 10 |
| SETTING 2 | 8 | 20 |
| SETTING 3 | 16 | 40 |
| SETTING 4 | 32 | 80 |

FIG.7

|   | Source [mA] | | Sink [mA] | |
|---|---|---|---|---|
|   | Ib(=Ib1) | Ia(=Ia1) | Ib(=Ib2) | Ia(=Ia2) |
| 0 | 100 | 5 | 180 | 5 |
| 1 | 150 | 8 | 270 | 8 |
| 2 | 200 | 10 | 360 | 10 |
| 3 | 300 | 15 | 540 | 15 |
| 4 |  | 20 |  | 20 |
| 5 |  | 30 |  | 30 |
| 6 |  | 40 |  | 40 |
| 7 |  | 80 |  | 80 |

FIG.15

| Ib [mA] | | DRI_CNTL_** | | | |
|---|---|---|---|---|---|
| Ib1 | Ib2 | 00 | 01 | 02 | 03 |
| 100 | 180 | ON | OFF | OFF | OFF |
| 150 | 270 | ON | ON | OFF | OFF |
| 200 | 360 | ON | ON | ON | OFF |
| 300 | 540 | ON | ON | ON | ON |

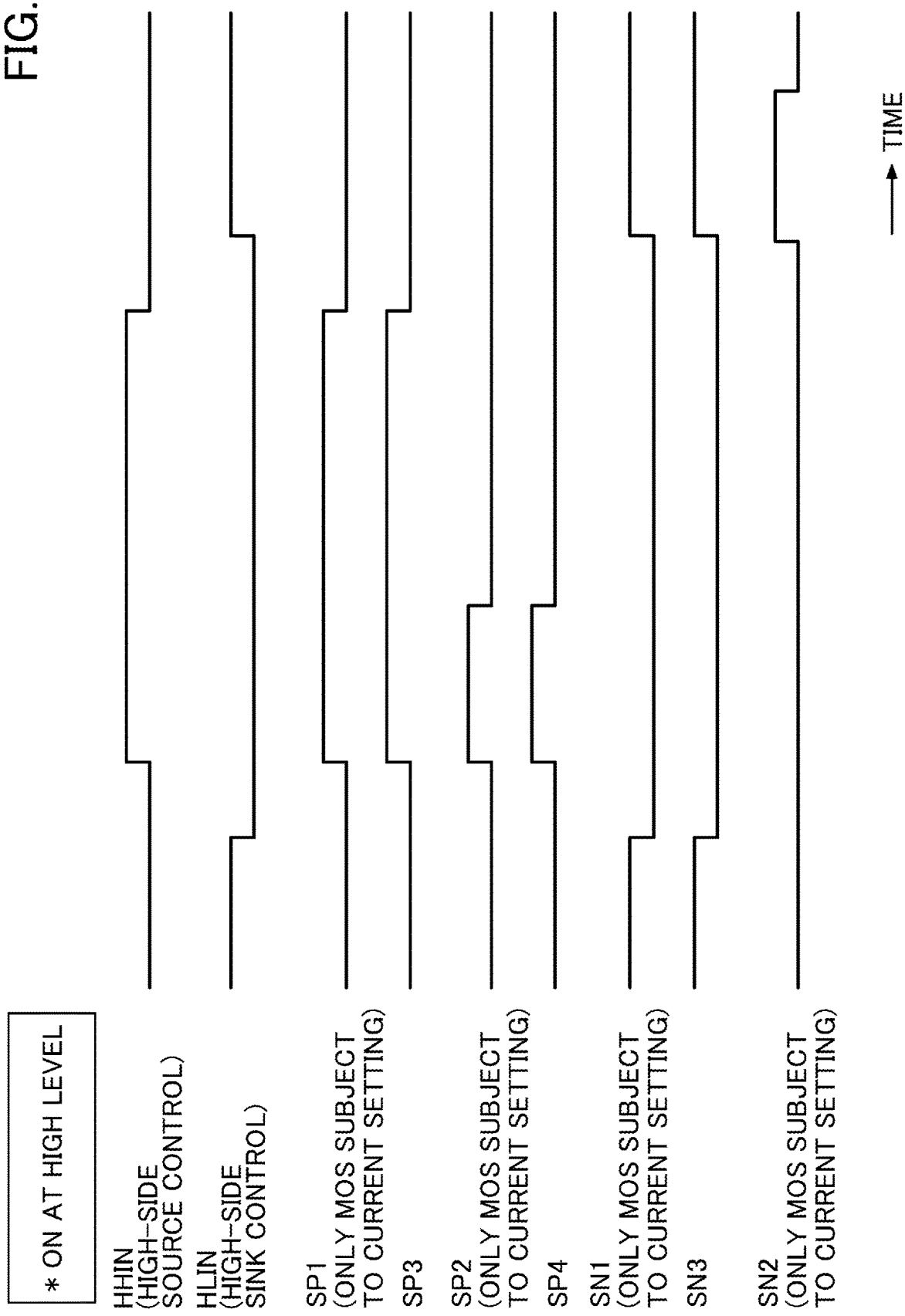

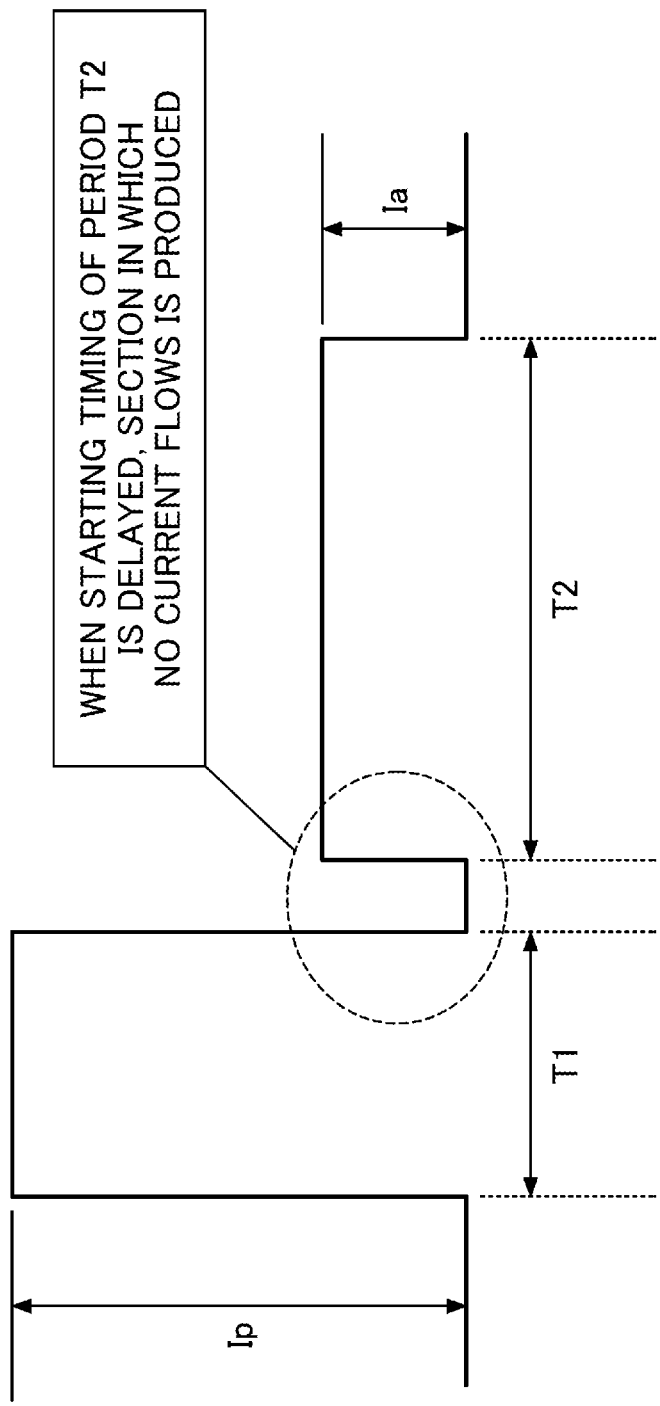

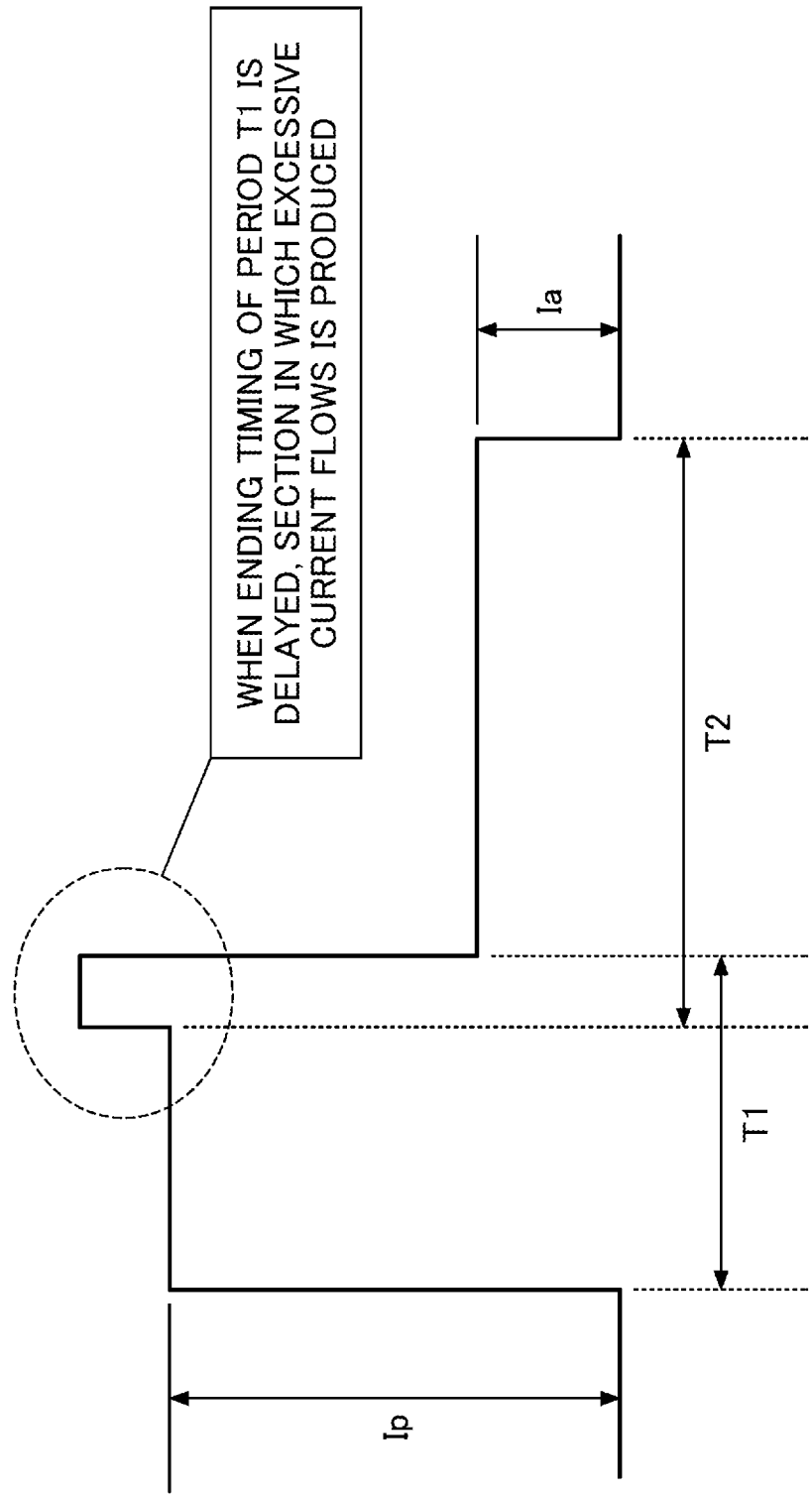

DRIVE CIRCUIT

CROSS-REFERENCE TO RELATED APPLICATION

The present application is based on and claims priority under 35 U.S.C. § 119 to Japanese Patent Application No. 2022-201512, filed on Dec. 16, 2022, and Japanese Patent Application No. 2022-201513, filed on Dec. 16, 2022, the contents of which are incorporated herein by reference in their entirety.

BACKGROUND OF THE INVENTION

1. Field of the Invention

The present disclosure relate to a drive circuit.

2. Description of the Related Art

There is a technique to drive transistors by using slew-rate control in order to achieve enhanced electro-magnetic compatibility (EMC) performance (see, for example, FIG. 2a and FIG. 2b of Patent Document 1).

FIG. 2a of Patent Document 1 shows slew-rate control in which, in response to a turn-on command, a high-level current $I_1$ is supplied to the gate terminal of a transistor for a time duration of $t_1$. The time duration $t_1$ ends before the Miller plateau begins. During this time duration $t_1$, the input capacitance of the transistor is rapidly charged, and the gate voltage rises to an intermediate level. At the end of the time duration $t_1$, the current that flows through the gate terminal changes from the high-level current $I_1$ to a low-level current $I_2$. This low-level current $I_2$ is maintained throughout the Miller plateau, and the transistor's $V_{DS}$ drops.

Meanwhile, FIG. 2b of Patent Document 1 shows slew-rate control in which, in response to a turn-off command, the high-level current $I_1$ is drawn from the gate terminal of the transistor for the time duration $t_1$. During this time duration $t_1$, the input capacitance of the transistor is discharged rapidly, and the gate voltage drops to an intermediate level. At the end of the time duration $t_1$, the current drawn from the gate terminal changes from the high-level current $I_1$ to a low-level current $I_2$. This low-level current $I_2$ is maintained throughout the Miller plateau, and the transistor's $V_{DS}$ increases.

RELATED-ART DOCUMENT

Patent Document

[Patent Document 1] U.S. Pat. No. 9,294,084 Specification

SUMMARY OF THE INVENTION

Problem to be Solved by the Invention

When driving a high-side transistor and a low-side transistor together, a dead time, which is a period in which both transistors are in an off state, is provided to prevent a through current from flowing in both transistors when both transistors are turned on at the same time. A period (boost period) in which a high-level current such as the one described above flows appears immediately after the end of the dead time.

The present disclosure therefore provides a drive circuit whereby these dead time and boost period can be generated accurately.

Means for Solving the Problem

According to a first embodiment of the present disclosure, a drive circuit includes:
 a drive terminal;
 a first source current source configured to generate a first source current that flows through the drive terminal;
 a second source current source configured to generate a second source current that is added to the first source current;
 a first sink current source configured to generate a first sink current that flows through the drive terminal;
 a second sink current source configured to generate a second sink current that is added to the first sink current;
 a logic circuit configured to generate a source drive command for operating the first source current source and a sink drive command for operating the first sink current source, in accordance with a clock, such that the first source current and the first sink current flow alternately, with dead times in between, each dead time being a period in which flows of the first source current and the first sink current are stopped; and
 a control circuit configured to generate a source boost signal and a sink boost signal in accordance with the clock,
  the source boost signal operating the second source current source such that the second source current starts flowing through the drive terminal immediately after a first one of the dead times ends, and then stops flowing, and
  the sink boost signal operating the second sink current that the second sink current starts flowing through the drive terminal immediately after a second one of the dead times ends, and then stops flowing.

According to a second embodiment of the present disclosure, a drive circuit includes:
 a drive terminal;
 a first source current source configured to generate a first source current that flows through the drive terminal;
 a second source current source configured to generate a second source current that is added to the first source current;
 a first sink current source configured to generate a first sink current that flows through the drive terminal;
 a second sink current source configured to generate a second sink current that is added to the first sink current; and
 a control circuit configured such that:
  when a source drive command becomes an ON command, the first source current and the second source current start flowing through the drive terminal, and then a flow of the second source current is stopped;
  when the source drive command becomes an OFF command, a flow of the first source current is stopped;
  when a sink drive command becomes the ON command, the first sink current and the second sink current start flowing through the drive terminal, and then a flow of the second sink current is stopped; and
  when the sink drive command becomes the OFF command, a flow of the first sink current is stopped, wherein the control circuit generates a first dead time, a second dead time, a first boost period, and a second boost period, in accordance with a common clock, the first dead time being a period from when the sink drive command becomes the OFF command, until the source drive command becomes the ON command, the second dead time being a period from when the source drive command becomes the OFF command, until the sink drive command becomes the ON command, the first boost period being a period in which the second source current is added to the first source current, and the second boost period being a period in which the second sink current is added to the first sink current.

Effect of the Invention

According to one embodiment of the present disclosure, it is possible to provide a drive circuit whereby dead times and boost periods can be generated accurately.

BRIEF DESCRIPTION OF THE DRAWINGS

FIG. 2 is a diagram that illustrates operating waveforms that are exhibited when a transistor to be driven by a drive circuit is turned on;

FIG. 5 is a diagram that shows an example of a table that stores setting values for setting the magnitude of a high-level current and a low-level current, in a comparative example in which both currents are generated from one current source;

FIG. 7 is a diagram that shows an example of a table that stores setting values for setting the magnitude of a high-level current and a low-level current, in one embodiment in which both currents are generated from multiple current sources;

FIG. 15 is a diagram that shows an example of a table that stores setting signals for setting the magnitude of boost currents by using a current setting circuit;

FIG. 16 is a timing chart that shows an example of operation of the drive circuit shown in FIG. 14;

FIG. 17 is a diagram that shows an example of an unsmooth transition from a high-level current to a low-level current; and FIG. 18 is a diagram that shows an example of an unsmooth transition from a high-level current to a low-level current.

MODE OF CARRYING OUT THE INVENTION

An embodiment of the present disclosure will be explained below with reference to the accompanying drawings.

Figure 1:
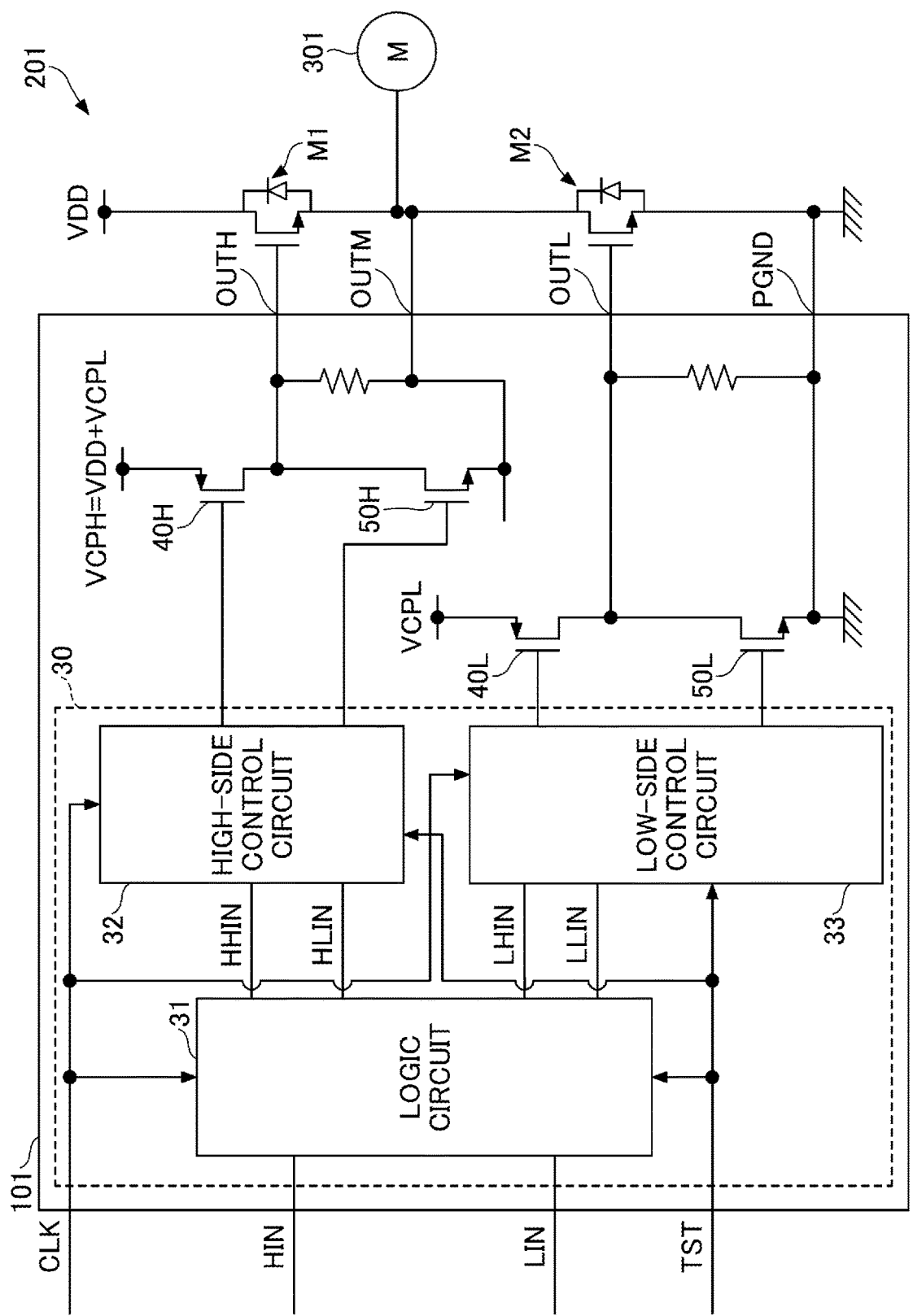
FIG. 1 is a diagram that shows an example structure of a power conversion circuit including a drive circuit according to one embodiment.

FIG. 1 is a diagram that shows an example structure of a power conversion circuit including a drive circuit according to one embodiment. A power conversion circuit 201 converts a DC voltage VDD, which is supplied from a DC source, into an AC voltage to be supplied to a load 301 such as a motor M. The power conversion circuit 201 includes a high-side transistor M1, a low-side transistor M2, and a drive circuit 101 that drives the transistors M1 and M2.

In the event the power conversion circuit 201 is, for example, an inverter that generates three-phase AC power with U, V, and W phases, the power conversion circuit 201 includes three switching circuits of the same structure, each switching circuit having the transistors M1 and M2 and the drive circuit 101. FIG. 1 shows one of multiple switching circuits (for example, three switching circuits for U, V, and W phases) included in the power conversion circuit 201.

The power conversion circuit 201 is not limited to an inverter that converts direct current into alternating current, and may be a converter that converts direct current into direct current. The power conversion circuit 201 may be used as a power source circuit. The load 301 is, for example, a motor that rotates a cooling fan or the like, but the type of the load 301 is not limited to this.

The drive circuit 101 drives the transistors M1 and M2, attached externally to the drive circuit 101. The transistors M1 and M2 are gate drive switching elements having a first main electrode, a second main electrode, and a gate electrode. Their specific examples include an N-channel field effect transistor (FET) with a drain, a source, and a gate, an insulated gate bipolar transistor (IGBT) with a collector, an emitter, and a gate, and so forth. A metal-oxide-semiconductor field-effect transistor (MOSFET) is a specific example of an FET. The drain or collector is an example of the first main electrode. The source or emitter is an example of the second main electrode. FIG. 1 illustrates a case in which the transistors M1 and M2 are N-channel FETs.

The drive circuit 101 is a pre-driver that drives the transistors M1 and M2 that drive the load 301 such as the motor M. The drive circuit 101 is formed with an integrated circuit, for example.

The drive circuit 101 switches on or off the transistors M1 and M2 by driving the transistors M1 and M2 in accordance with signals (a clock CLK, a high-side command signal HIN, and a low-side command signal LIN) supplied from a controller (not shown). The high-side command signal HIN and the low-side command signal LIN change in sync with the clock CLK. The high-side command signal HIN includes an ON command that commands to turn on the high-side transistor M1, and an OFF command that commands to turn off the high-side transistor M1. The low-side command signal LIN includes an ON command that commands to turn on the low-side transistor M2, and an OFF command that commands to turn off the low-side transistor M2. The drive circuit 101 turns on the transistors M1 and M2 alternately, in accordance with the high-side command signal HIN and the low-side command signal LIN.

The drive circuit 101 includes a control circuit 30, a high-side source current source 40H, a high-side sink current source 50H, a low-side source current source 40L, and a low-side sink current source 50L. Also, the drive circuit 101 includes a high-side drive terminal OUTH, an middle terminal OUTM, a low-side drive terminal OUTL and a ground terminal PGND.

The control circuit 30 controls a source current source 40H that turns on the transistor M1, and controls the sink current source 50H that turns off the transistor M1. The control circuit 30 controls a source current source 40L that turns on the transistor M2, and controls the sink current source 50L that turns off the transistor M2. The control circuit 30 includes a logic circuit 31, a high-side control circuit 32, and a low-side control circuit 33.

The logic circuit 31 generates a source control drive command HHIN and a sink control drive command HLIN, based on the high-side command signal HIN and the low-side command signal LIN. The logic circuit 31 generates a source control drive command LHIN and a sink control drive command LLIN, based on the high-side command signal HIN and the low-side command signal LIN. The logic circuit 31 may be situated outside the control circuit 30 or the drive circuit 101. The drive command HHIN is an example of a source drive command. The drive command HLIN is an example of a sink drive command.

Figure 9:
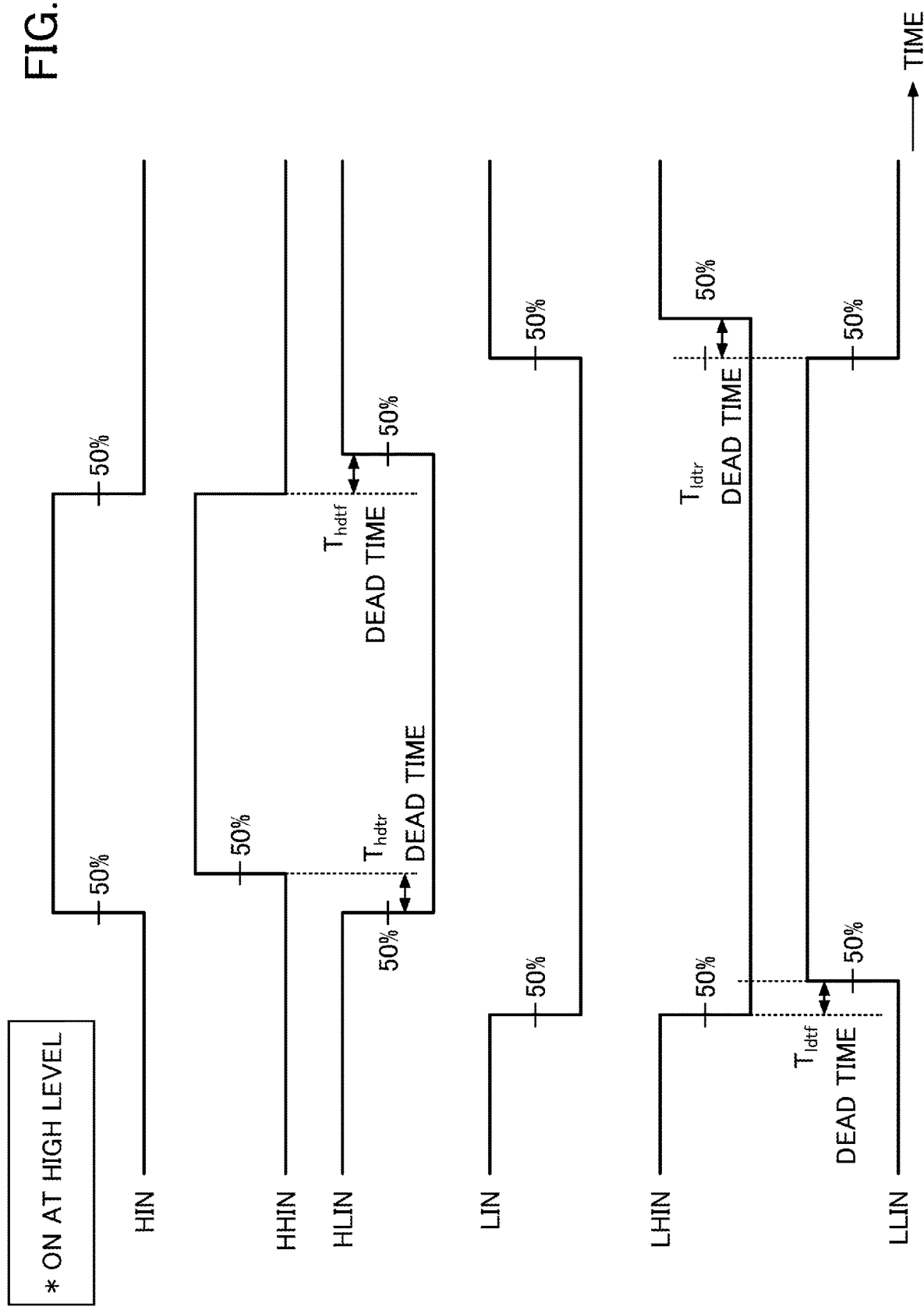
FIG. 9 is a diagram that illustrates dead times individually.

The high-side control circuit 32 controls the source current, which is generated by the high-side source current source 40H, in accordance with the source control drive command HHIN. The high-side control circuit 32 controls the sink current, which is generated by the high-side sink current source 50H, in accordance with the sink control drive command HLIN. The high-side control circuit 32 turns on the output transistors of the current sources 40H 50H alternately, with dead times $T_{hdtr}$ and $T_{hdtf}$ (see FIG. 9) in between, in which the output transistors of the current sources 40H and 50H are turned off, in accordance with the drive command HHIN and the drive command HLIN.

The low-side control circuit 33 controls the source current, which is generated by the low-side source current source 40L, in accordance with the source control drive command LHIN. The low-side control circuit 33 controls the sink current, which is generated by the low-side sink current source 50L, in accordance with the sink control drive command LLIN. The low-side control circuit 33 turns on the output transistors of the current sources 40L and 50L alternately, with dead times $T_{ldtf}$ and $T_{ldtr}$ (see FIG. 9) in between, in which the output transistors of the current sources 40L and 50L are turned off, in accordance with the drive command LHIN and the drive command LLIN.

The source current source 40H includes an output transistor formed with a P-channel MOSFET, and generates a source current that flows through the gate of the transistor M1. The source current source 40H is connected between the drive terminal OUTH connected to the gate of the transistor M1, and a power source node of a high-side power source voltage VCPH.

The power source voltage VCPH is equal to the sum of a DC voltage VDD and a low-side power source voltage VCPL. The power source voltage VCPH is generated by a charge pump (not shown) by using, for example, the DC voltage VDD and the power source voltage VCPL.

The sink current source 50H includes an output transistor formed with an N-channel MOSFET, and generates a sink current that is drawn from the gate of the transistor M1. The sink current source 50H is connected between the drive terminal OUTH connected to the gate of the transistor M1, and the middle terminal OUTM connected to the load 301.

The source current source 40L includes an output transistor formed with a P-channel MOSFET, and generates a source current that flows through the gate of the transistor M2. The source current source 40L is connected between the drive terminal OUTL connected to the gate of the transistor M2, and the power source node of the low-side power source voltage VCPL.

The sink current source 50L includes an output transistor formed with an N-channel MOSFET, and generates a sink current that is drawn from the gate of the transistor M2. The sink current source 50L is connected between the drive terminal OUTL connected to the gate of the transistor M2, and the ground terminal PGND connected to the ground.

The drive circuit 101 drives the transistors M1 and M2 using a constant current drive method. The drive circuit 101 applies a source current from a PMOS output transistor of the source current source 40H, to the drive terminal OUTH, thereby charging the gate of the transistor M1 and turning on the transistor M1. The drive circuit 101 draws a sink current from the drive terminal OUTH, into the NMOS output transistor of the sink current source 50H, thereby discharging the gate of the transistor M1 turning and off the transistor M1. Similarly, the drive circuit 101 applies a source current from the PMOS output transistor of the source current source 40L, to the drive terminal OUTL, thereby charging the gate of the transistor M2 and turning on the transistor M2. The drive circuit 101 draws a sink current from the drive terminal OUTL, into the NMOS output transistor of the sink current source 50L, thereby discharging the gate of the transistor M2 and turning off the transistor M2.

Figure 2:
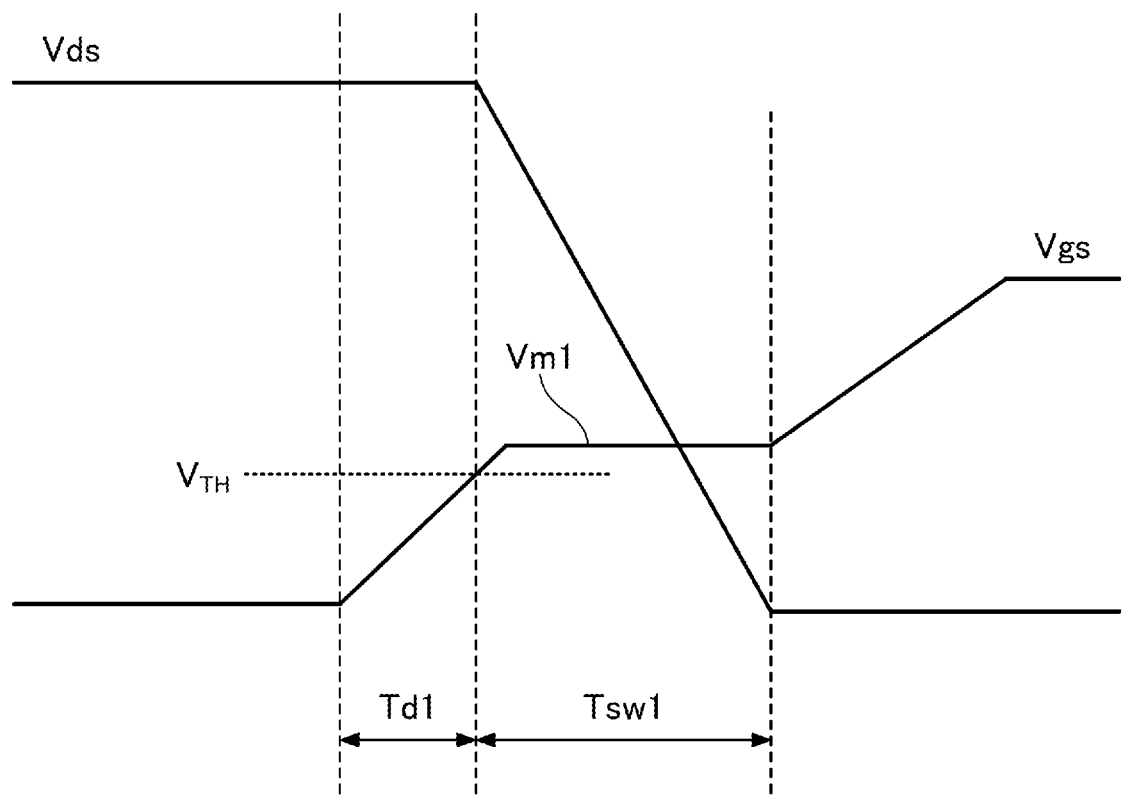

FIG. 2 shows operating waveforms that are exhibited when the transistor M1 or the transistor M2 is turned on. The gate voltage Vgs of the transistor M1 (M2) rises continuously to a Miller voltage Vm1 due to the inflow of the source current generated by the source current source 40H (40L), and then further rises beyond the Miller voltage Vm1.

During a delay period Td1, which lasts until the gate voltage Vgs of the transistor M1 (M2) exceeds a gate threshold voltage VTH, the drain-source voltage Vds of the transistor M1 (M2) does not change. In other words, the delay period Td1 may be a waste of time because it makes no contribution to the driving of the load 301. On the other hand, when the switching period Tsw1 in which the drain-source voltage Vds drops brings becomes longer, this about an effect of improving electro-magnetic interference (EMI).

At the source current source 40H (40L), the high-level source current flows during the delay period Td1 and then the low-level source current flows, so that the delay period Td1 becomes shorter, and the switching period Tsw1 becomes longer. By this means, when the transistor M1 (M2) is turned on, the time that makes no contribution to the driving of the load 301 and that therefore is wasteful becomes shorter, which then results in improved EMI.

Figure 3:
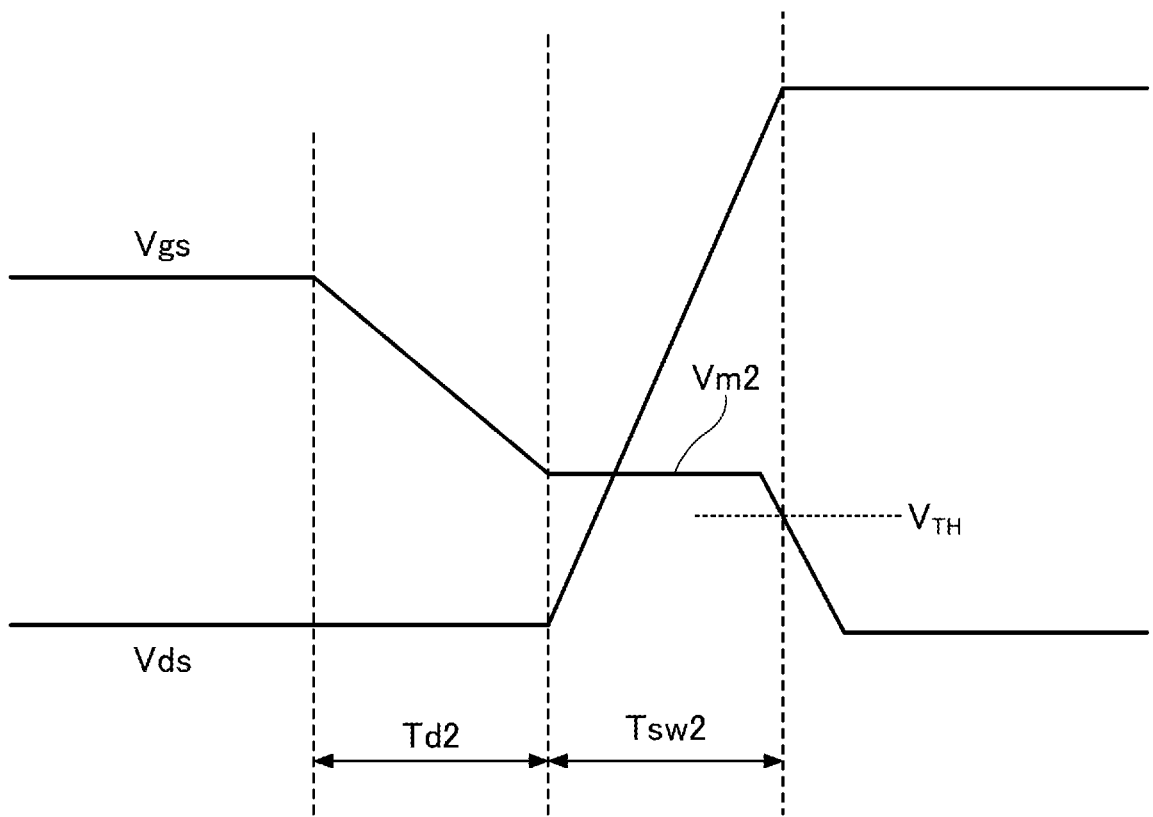
FIG. 3 is a diagram that illustrates operating waveforms that are exhibited when a transistor to be driven by a drive circuit is turned off.

FIG. 3 shows the operating waveform that is exhibited when the transistor M1 or transistor M2 is turned off. The gate voltage Vgs of the transistor M1 (M2) drops continuously to a Miller voltage Vm2 due to the sink current generated by the current source 50H (50L) on the sink side being drawn in, and then drops further below the Miller voltage Vm2.

During a delay period Td2, which lasts until the gate voltage Vgs of the transistor M1 (M2) reaches the Miller voltage Vm2, the drain-source voltage Vds of the transistor M1 (M2) does not change. In other words, the delay period Td2 may be a waste of time because it makes no contribution to the driving of the load 301. On the other hand, when the switching period Tsw2 in which the drain-source voltage Vds increases becomes longer, this brings about an effect of improving electro-magnetic interference (EMI).

At the sink current source 50H (50L), when the high-level sink current flows during the delay period Td2 and then low-level sink current flows, the delay period Td2 becomes shorter, and the switching period Tsw2 becomes longer. By this means, when the transistor M1 (M2) is turned off, the time that makes no contribution to the driving of the load 301 and that therefore is wasteful becomes shorter, which then results in improved EMI.

However, referring to FIG. 1 and FIG. 2, when a high-level source current and a low-level source current are generated from one source current source, the greater the difference between the high-level source current and the low-level source current, the greater the error of each source current. As will be described later, the present embodiments source current source 40H (40L) outputs a first source current Ia1 that is generated as the low-level source current, and a second source current Ib1 that is added to the first source current Ia1 to generate the high-level source current, from separate MOSs. This makes it possible to select an MOS of an appropriate size according to the current value, thereby improving the accuracy of both the first source current Ia1 and the second source current Ib1.

Similarly, referring to FIG. 1 and FIG. 3, when a high-level sink current and a low-level sink current are generated by one sink current source, the greater the difference between the high-level sink current and the low-level sink current, the greater the error of each sink current. As will be described later, the sink current source 50H (50L) of the present embodiment outputs a first sink current Ia2 that is generated as the low-level sink current, and a second sink current Ib that is added to the first sink current Ia2 to generate the high-level sink current, from separate MOSs. This makes it possible to select an MOS of an appropriate size according to the current value, thereby improving the accuracy of both the first sink current Ia2 and the second sink current Ib2.

Figure 4:
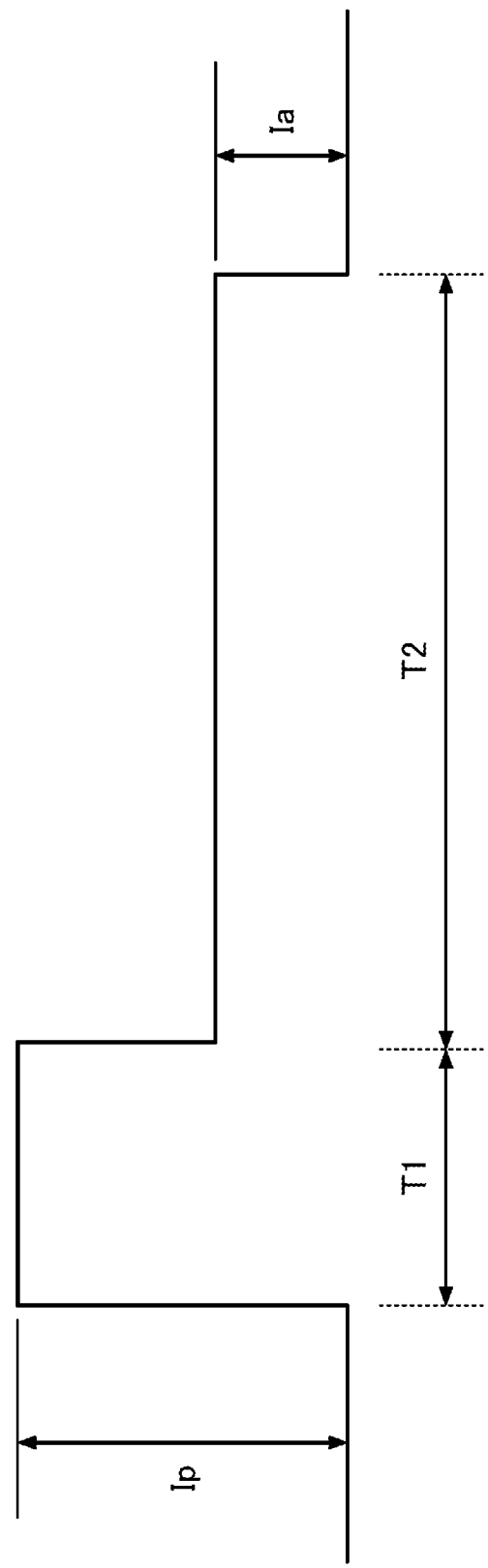
FIG. 4 is a current-waveform diagram for explaining a comparative example in which a high-level current and a low-level current are generated from one current source.

For example, FIG. 4 is a current-waveform diagram for explaining a comparative example in which a high-level current Ip and a low-level current Ia are generated from one current source. FIG. 5 shows an example of a table that stores setting values for setting the magnitude of the high-level current Ip and the low-level current Ia, in a comparative example in which both currents Ip and Ia are generated from one current source. The number of setting values and the current values set by each setting value are simply examples.

In FIG. 4, in accordance with a first setting value (for example, the setting value 4) selected from among the setting values 1 to 4 shown in FIG. 5, from one source current source, a source current Ip of a high current value (for example, 32 mA), which is set by the first setting value, flows in the period T1. Then, in FIG. 4, in accordance with a second setting value (for example, the setting value 1) selected from among the setting values 1 to 4 shown in FIG. 5, from that one source current source, a source current Ia of a low current value (for example, 4 mA), which is configured by the second setting value, flows in the period T2. In this case, the greater the difference between the high current value of the source current Ip and the low current value of the source current Ia, the wider the range of current values that one source current source has to cover, and thus the error between the current values of the source current Ip and the source current Ia increases.

Similarly, in FIG. 4, in accordance with the first setting value (for example, the setting value 4) selected from among the setting values 1 to 4 shown in FIG. 5, from one sink current source, a sink current Ip of a high current value (for example, 80 mA), which is set by the first setting value, flows in the period T1. Then, in FIG. 4, in accordance with the second setting value (for example, the setting value 1) selected from among the setting values 1 to 4 shown in FIG. 5, from that one sink current source, a sink current Ia of a low current value (for example, 10 mA), which is set by the second setting value, flows in the period T2. In this case, the greater the difference between the high current value of the sink current Ip and the low current value of the sink current Ia, the wider the range of current values that one sink current source has to cover, and thus the error between the current values of the source current Ip and the sink current Ia increases.

Figure 6:
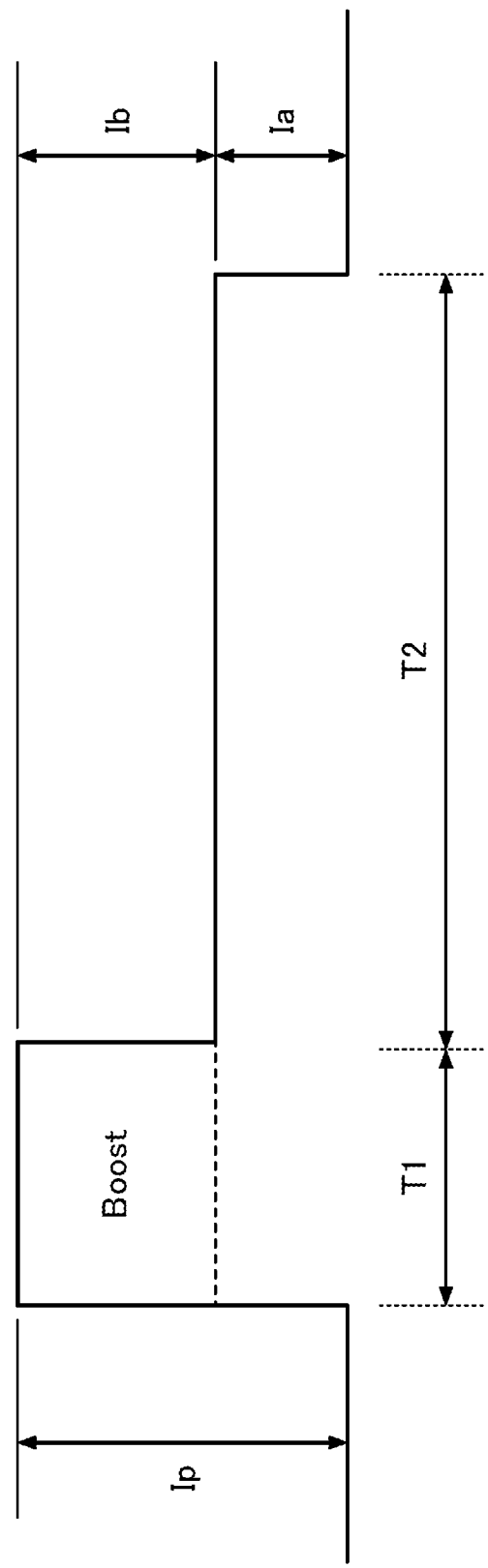
FIG. 6 is a current-waveform diagram for explaining one embodiment, in which a high-level current and a low-level current are generated from multiple current sources.

By contrast with this, FIG. 6 is a current-waveform diagram for explaining one embodiment in which the high-level current Ip and the low-level current Ia are generated from multiple current sources. FIG. 7 is a diagram that shows an example of a table that stores setting values for setting the magnitude of the high-level current Ip and the low-level current Ia in one embodiment in which the currents Ip and Ia are generated from multiple current sources. The number of setting values and the current values set by each setting value are simply examples. Such a table is stored in a memory in the drive circuit 101.

For example, in the drive circuit 101 of the present embodiment, the multiple source current sources include a first source current source and a second source current source. In FIG. 6, in accordance with the first setting value (for example, the setting value 0) selected from among the setting values 0 to 7 shown in FIG. 7, from the first source current source, a first source current Ia1 of a low current value (for example, 5 mA), which is configured by the first setting value, flows in both periods T1 and T2. In accordance with a second setting value (for example, the setting value 3) selected from among the setting values 0 to 3 shown in FIG. 7, from the second source current source, a second source current Ib1 of a boost current value (for example, 300 mA), which is configured by the second setting value, flows in the period T1 alone, and the second source current Ib1 does not flow in the period T2. That is, the second source current Ib1 generated by the second source current source is added to the first source current Ia1 generated by the first source current source, only in the period T1, as a boost current Ib.

In this way, the high-level source current Ip is determined by the sum of the first source current Ia1 generated by the first source current source, and the second source current Ib1 generated by the second source current source. On the other hand, the first source current Ia1 generated by the first source current source is used as is as the low-level source current Ia.

The drive circuit 101 applies the first source current Ia1 and the second source current Ib1, and then stops the flow of the second source current Ib1 by turning off the output of the second source current source, so that the source current Ip makes a smooth transition from the high level to the low level. This can reduce the possibility that the source current Ip is a mismatch when switching from the high level to the low level. For example, as shown in FIG. 17, the possibility that a period in which no current flows is produced due to a delay in the starting timing of the period T2 can be reduced. Furthermore, as shown in FIG. 18, the possibility that a period in which excessive current flows is produced due to a delay in the end timing of the period T1 can be reduced. Therefore, even if the difference between the high current value of the source current Ip and the low current value of the source current Ia is relatively large, the drive circuit 101 can implement slew-rate control whereby a smooth transition can be made from the source current Ip to the source current Ia. Also, since the first source current Ia1 and the second source current Ib1 are output from separate current sources an MOS of an appropriate size can be selected according to the current value, the accuracy of both the first source current Ia1 and the second source current Ib1 improves.

For example, in the drive circuit 101 of the present embodiment, the multiple sink current sources include a first sink current source and a second sink current source. In FIG. 6, in accordance with the first setting value (for example, the setting value 0) selected from among the setting values 0 to 7 shown in FIG. 7, from the first sink current source, a first sink current Ia2 of a low current value (for example, 5 mA), which is configured by the first setting value, flows throughout the periods T1 and T2. In accordance with the second setting value (for example, the setting value 3) selected from among the setting values 0 to 3 shown in FIG. 7, from the second source current source, a second sink current Ib2 of a boost current value (for example, 540 mA), which is configured by the second setting value, flows in the period T1 alone, and the second sink current Ib2 does not flow in the period T2. That is, the second sink current Ib2 generated by the second sink current source is added to the first sink current Ia2 generated by the first sink current source, only in the period T1, as a boost current Ib.

In this way, the high-level source current Ip is determined by the sum of the first sink current Ia2 generated by the first sink current source and the second sink current Ib2 generated by the second sink current source. On the other hand, the first sink current Ia2 generated by the first sink current source is used as is as the low-level sink current Ia.

The drive circuit 101 applies the first sink current Ia2 and the second sink current Ib2, and then stops the flow of the second sink current Ib2 by turning off the output of the second sink current source, so that the sink current Ip makes a smooth transition from the high level to the low level. This can reduce the possibility that the sink current Ip is a mismatch when switching from the high level to the low level. For example, as shown in FIG. 17, the possibility that a period in which no current flows is produced due to a delay in the starting timing of the period T2 can be reduced. Furthermore, as shown in FIG. 18, the possibility that a period in which excessive current flows is produced due to a delay in the end timing of the period T1 can be reduced. Therefore, even if the difference between the high current value of the sink current Ip and the low current value of the sink current Ia is relatively large, the drive circuit 101 can implement slew-rate control whereby a smooth transition can be made from the sink current Ip to the sink current Ia. Also, since the first sink current Ia2 and the second sink current Ib2 are output from separate current sources and an MOS of an appropriate size can be selected according to the current value, the accuracy of both the first sink current Ia2 and the second sink current Ib2 improves.

Figure 8:
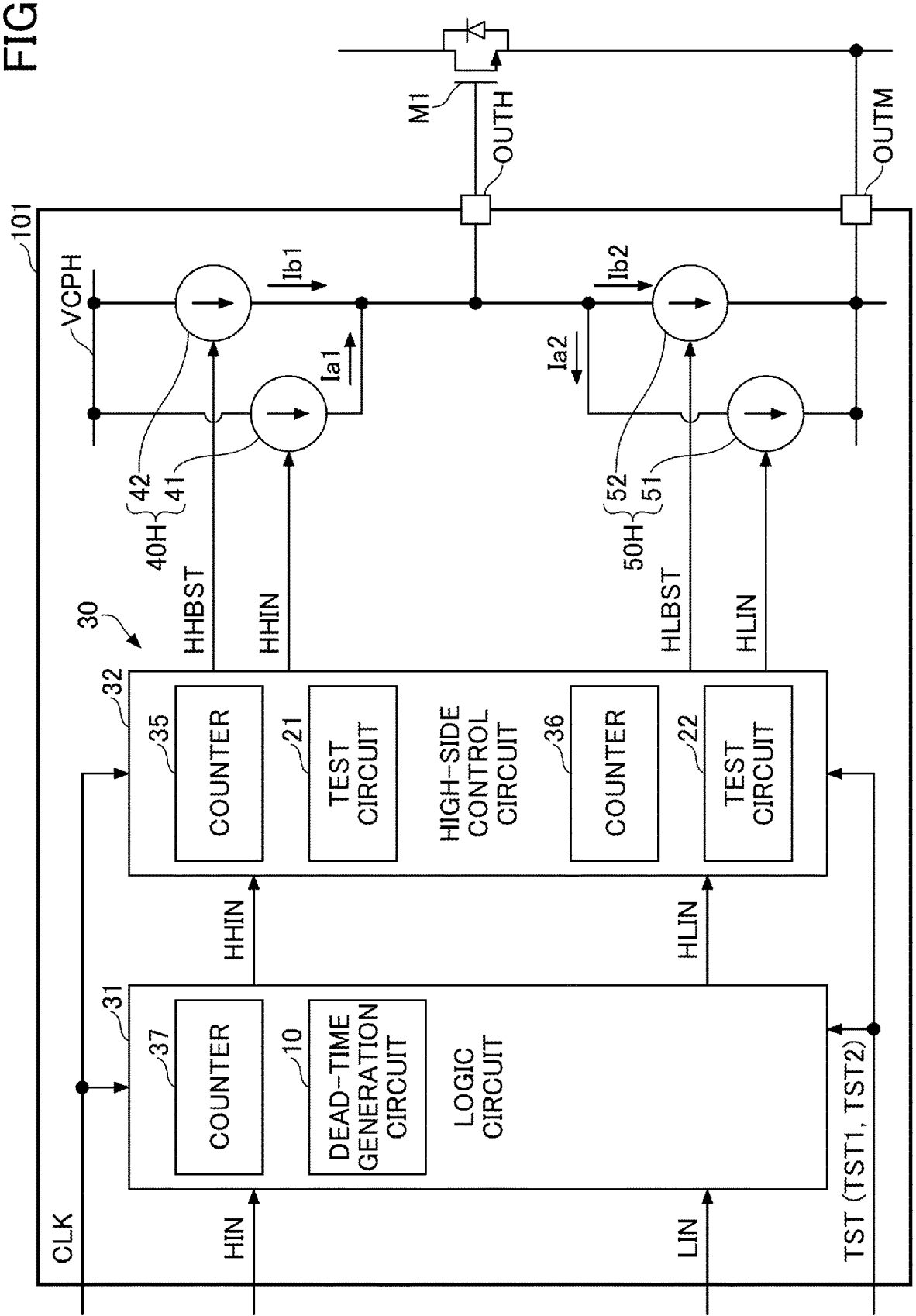
FIG. 8 is a diagram that shows an example structure of a drive circuit according to one embodiment, in which a high-level current and a low-level current are generated from multiple current sources.

FIG. 8 is a diagram that shows an example structure of a drive circuit according to one embodiment, in which a high-level current and a low-level current are generated from multiple current sources. FIG. 8 shows a part of a high-side drive circuit that drives the high-side transistor M1, in the drive circuit 101 shown in FIG. 1. The basic structure of the low-side drive circuit that drives the low-side transistor M2 may be the same as the structure of the high-side drive circuit shown in FIG. 8. Description of the low-side drive circuit will be omitted by referring to the following description of the high-side drive circuit.

The drive circuit 101 includes a logic circuit 31, a high-side control circuit 32, a source current source 40H, and a sink current source 50H. The logic circuit 31 is common between the high-side drive circuit and the low-side drive circuit.

In FIG. 8, the source current source 40H includes a first source current source 41 that generates a first source current Ia1 that flows through a drive terminal OUTH, and a second source current source 42 that generates a second source current Ib1 that is added to the first source current Ia1. The first source current source 41 corresponds to the first current source or a part thereof. The second source current source 42 corresponds to the second current source or a part thereof. When the source control drive command HHIN changes from an OFF command to an ON command, the high-side control circuit 32 applies the first source current Ia1 and the second source current Ib1 to the drive terminal OUTH, and then stops the flow of the second source current Ib1. Then, when the source control drive command HHIN changes from an ON command to an OFF command, the high-side control circuit 32 stops the flow of the first source current Ia1. By this means, the source current that enters the gate of the transistor M1 via the drive terminal OUTH makes a smooth transition from the high-level source current Ip to the low-level source current Ia, as shown in FIG. 6. Therefore, the drive circuit 101 allows a smooth transition from the source current Ip to the source current Ia, and, furthermore, enables slew-rate control whereby the accuracy of both the source current Ip and the source current Ia improves.

Referring to FIG. 8, when, for example, the drive command HHIN switches from an OFF command to an ON command and then a predetermined first threshold time Tth1 elapses, the high-side control circuit 32 may stop the flow of the second source current Ib1. This improves the accuracy of the time from when the drive command HHIN switches from an OFF command to an ON command until the high-level source current Ip switches to the low-level source current Ia. The elapse of the first threshold time Tth1 is measured by, for example, a timer or a counter 35 that counts the pulses of the clock CLK. By synchronizing the drive command HHIN with the timer or the clock CLK used in the counter 35, the accuracy of the first threshold time Tth1, which is generated by the clock CLK, improves even further.

The first threshold Vth1 is set, for example, to a threshold that is lower than the Miller voltage Vm1 of the driven transistor (in this case, the transistor M1) connected to the drive terminal OUTH (see FIG. 2). This allows switching from the high-level source current Ip to the low-level source current Ia before the gate voltage Vgs reaches the Miller voltage Vm1. The first threshold Vth1 may be equal to the gate threshold voltage VTH of the transistor M1. Rather than monitoring the elapse of a certain length of time, by comparing the detection value Vo with a threshold that is lower than the Miller voltage Vm1, the flow of the second source current Ib1 can be stopped before the Miller period in which the drain-source voltage Vds varies.

Referring to FIG. 8, when, for example, the drive command HHIN switches from an OFF command to an ON command and then a predetermined first threshold time Tth1 elapses, the high-side control circuit 32 may stop the flow of the second source current Ib1. This improves the accuracy of the time from when the drive command HHIN switches from an OFF command to an ON command until the high-level source current Ip switches to the low-level source current Ia. The elapse of the first threshold time Tth1 is measured by, for example, a timer or a counter. By synchronizing the drive command HHIN with the timer or the clock CLK used in the counter, the accuracy of the first threshold time Tth1, which is generated by the clock CLK, improves even further.

In FIG. 7, the value of the second source current Ib1 is set higher than the value of the first source current Ia1, and thus a boost current Ib that is greater than the first source current Ia1 is generated. As a result of this, the delay period Td1 (see FIG. 2) becomes shorter, so that the turn-on speed of the transistors can be increased.

In FIG. 7, the high-side control circuit 32 selects the value of the first source current Ia1 from among multiple different values for the first source current Ia1, included in a first current value group, and selects the value of a second source current Ib1 from among multiple different values for the second source current Ib1, included in a second current value group. The lowest current value in the second current value group (100 mA in this example) is higher than the highest current value in the first current value group (in this example, 80 mA). By this means, a boost current Ib that is substantially greater than the first source current Ia1 is generated, so that the delay period Td1 can be made even shorter, and the turn-on speed of the transistors can be increased more.

In FIG. 8, the sink current source 50H includes a first sink current source 51 that generates a first sink current Ia2 that flows through the drive terminal OUTH, and a second sink current source 52 that generates second sink current Ib2 that is added to the first sink current Ia2. The first sink current source 51 corresponds to the first current source or a part thereof. The second sink current source 52 corresponds to the second current source or a part thereof. When the sink control drive command HLIN changes from an OFF command to an ON command, the high-side control circuit 32 applies the first sink current Ia2 and the second sink current Ib2 to the drive terminal OUTH, and then stops the flow of the second sink current Ib2. Then, when the sink control drive command HLIN changes from an ON command to an OFF command, the high-side control circuit 32 stops the flow of the first sink current Ia2. By this means, the sink current that is drawn from the gate of the transistor M1 via the drive terminal OUTH makes a smooth transition from the high-level sink current Ip to the low-level sink current Ia, as shown in FIG. 6. Therefore, the drive circuit 101 allows a smooth transition from the sink current Ip to the sink current Ia, and, furthermore, enables slew-rate control whereby the accuracy of both the sink current Ip and the sink current Ia improves.

Referring to FIG. 8, when, for example, the drive command HLIN switches from an OFF command to an ON command and then a predetermined second threshold time Tth2 elapses, the high-side control circuit 32 may stop the flow of the second sink current Ib2. This improves the accuracy of the time from when the drive command HLIN switches from an OFF command to an ON command until the high-level sink current Ip switches to the low-level sink current Ia. The elapse of the second threshold time Tth2 is measured by, for example, a timer or a counter 36 that counts the pulses of the clock CLK. By synchronizing the drive command HLIN with the timer or the clock CLK used in the counter 36, the accuracy of the second threshold time Tth2, which is generated by the clock CLK, improves even further.

The second threshold Vth2 is set, for example, to a threshold that is higher than the Miller voltage Vm2 of the driven transistor (in this case, the transistor M1) connected to the drive terminal OUTH (see FIG. 3). This allows switching from the high-level source current Ip to the low-level source current Ia before the gate voltage Vgs reaches the Miller voltage Vm2. Rather than monitoring the elapse of a certain length of time, by comparing the detection value Vo with a threshold that is higher than the Miller voltage Vm2, the flow of the second sink current Ib2 can be stopped before the Miller period in which the drain-source voltage Vds varies.

Referring to FIG. 8, when, for example, the drive command HLIN switches from an OFF command to an ON command and then a predetermined second threshold time Tth2 elapses, the high-side control circuit 32 may stop the flow of the second sink current Ib2. This improves the accuracy of the time from when the drive command HLIN switches from an OFF command to an ON command until the high-level sink current Ip switches to the low-level sink current Ia. The elapse of the second threshold time Tth2 is measured by, for example, a timer or the counter 36 that counts the pulses of the clock CLK. By synchronizing the drive command HLIN with the timer or the clock CLK used in the counter 36, the accuracy of the second threshold time Tth2, which is generated by the clock CLK, improves even further.

In FIG. 7, the value of the second sink current Ib2 is set higher than the value of the first sink current Ia2, and thus a boost current Ib that is greater than the first sink current Ia2 is generated. As a result of this, the delay period Td2 (see FIG. 3) becomes shorter, so that the turn-off speed of the transistors can be increased.

In FIG. 7, the high-side control circuit 32 selects the value of the first sink current Ia2 from among multiple different values for the first sink current Ia2, included in a first current value group, and selects the value of a second sink current Ib2 from among multiple different values for the second sink current Ib2, included in a second current value group. The lowest current value in the second current value group (180 mA in this example) is higher than the highest current value in the first current value group (in this example, 80 mA). By this means, a boost current Ib that is substantially greater than the first sink current Ia2 is generated, so that the delay period Td2 can be made even shorter, and the turn-off speed of the transistors can be increased more.

In FIG. 8, the logic circuit 31 has a counter 37 that, based on the high-side command signal HIN synchronized with the clock CLK, generates the drive command HHIN that operates the first source current source 41 and the drive command HLIN that operates the first sink current source 51 in accordance with the clock CLK. The counter 37 counts the pulses of the clock CLK.

Figure 10:
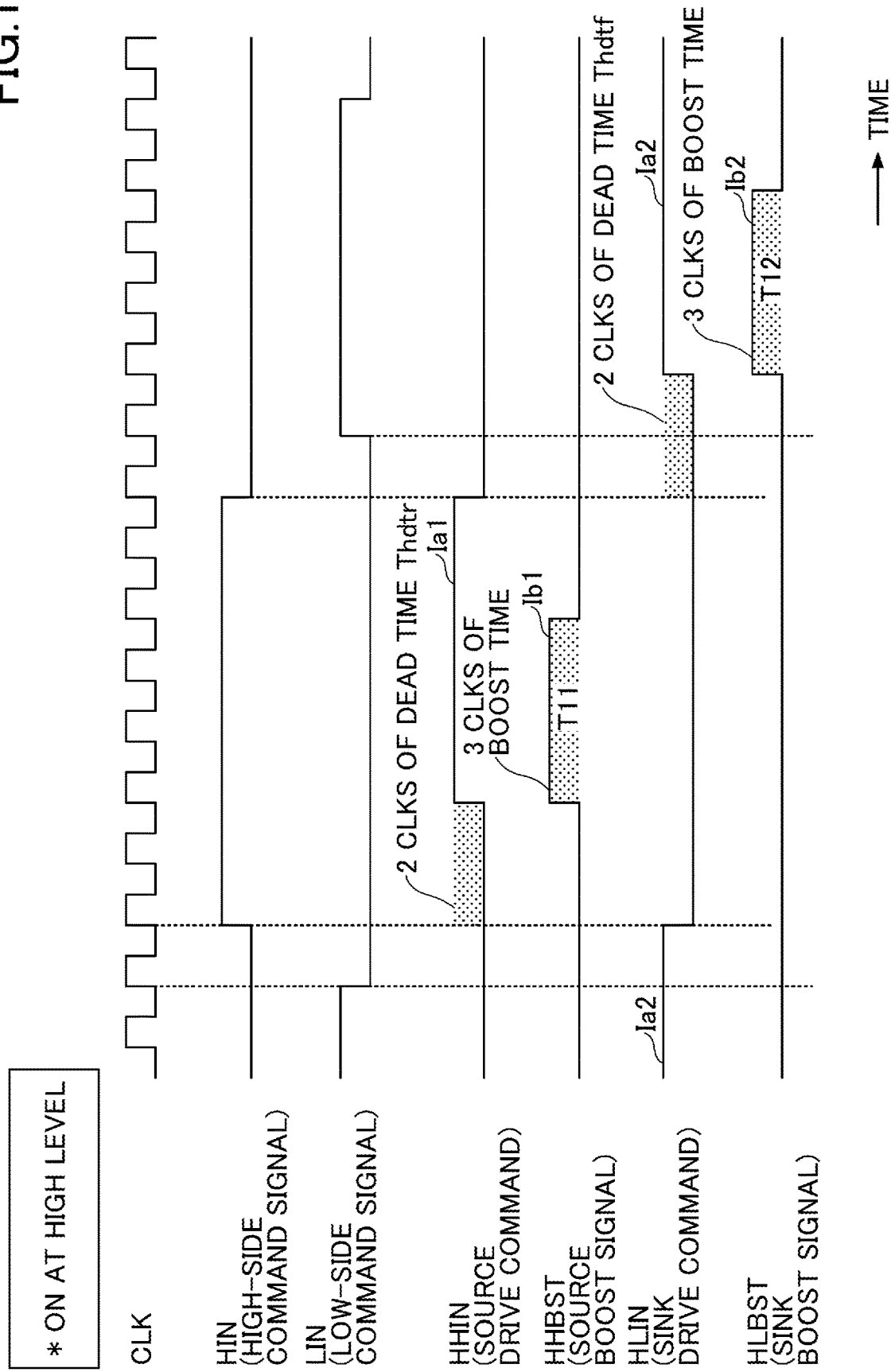
FIG. 10 is a diagram for explaining generation of dead times and boost periods.

The counter 37 generates the drive command HHIN and the drive command HLIN in accordance with the clock CLK, such that the first source current Ia1 and the first sink current Ia2 flow alternately, with dead times $T_{hdtr}$ and $T_{hdtf}$ (see FIG. 10) in between, in which the flow of the first source current Ia1 and the first sink current Ia2 stop. By this means, the drive command HHIN and the drive command HLIN synchronize with the clock CLK. In FIG. 10, the dead time $T_{hdtr}$ is an example of the first dead time from when the drive command HLIN becomes an OFF command, until the drive command HHIN becomes an ON command. The dead time $T_{hdtf}$ is an example of the second dead time from when the drive command HHIN becomes an OFF command, until the drive command HLIN becomes an ON command.

In FIG. 8, the high-side control circuit 32 has a counter 35 that generates a source boost signal HHBST, which operates the second source current source 42, in accordance with the clock CLK. The source boost signal HHBST is a signal for controlling the second source current Ib1, which is a boost current. The high-side control circuit 32 has a counter 36 that generates a sink boost signal HLBST, which operates the second sink current source 52, in accordance with the clock CLK. The sink boost signal HLBST is a signal for controlling the second sink current Ib2, which is a boost current. The counters 35 and 36 count the pulses of the clock CLK.

The counter 35 generates the source boost signal HHBST in accordance with the clock CLK, such that the second source current Ib1 flows through the drive terminal OUTH immediately after the dead time $T_{hdtr}$ (see FIG. 10) ends, and then the flow of the second source current Ib1 stops. By this means, the source boost signal HHBST synchronizes with the clock CLK. The boost period T11 is an example of the first boost period, in which the second source current Ib1 is added to the first source current Ia1.

The counter 36 generates the sink boost signal HLBST in accordance with the clock CLK, such that the second sink current Ib2 flows through the drive terminal OUTH immediately after the dead time $T_{hdtf}$ (see FIG. 10) ends, and then the flow of the second sink current Ib2 stops. By this means, the sink boost signal HLBST synchronizes with the clock CLK. The boost period T12 is an example of the second boost period, in which the second sink current Ib2 is added to the first sink current Ia1.

In this way, the drive command HHIN, the drive command HLIN, the source boost signal HHBST, and the sink boost signal HLBST are generated in accordance with a common clock CLK. By this means, the dead times $T_{hdtr}$ and $T_{hdtf}$ and the boost periods T11 and T12 are generated in accordance with a common clock CLK, so that they are generated accurately. Furthermore, since the drive command HHIN and the drive command HLIN are generated in accordance with the high-side command signal HIN that changes in sync with the common clock CLK, the dead times $T_{hdtr}$ and $T_{hdtf}$ and the boost periods T11 and T12 are generated even more accurately.

Figure 11:
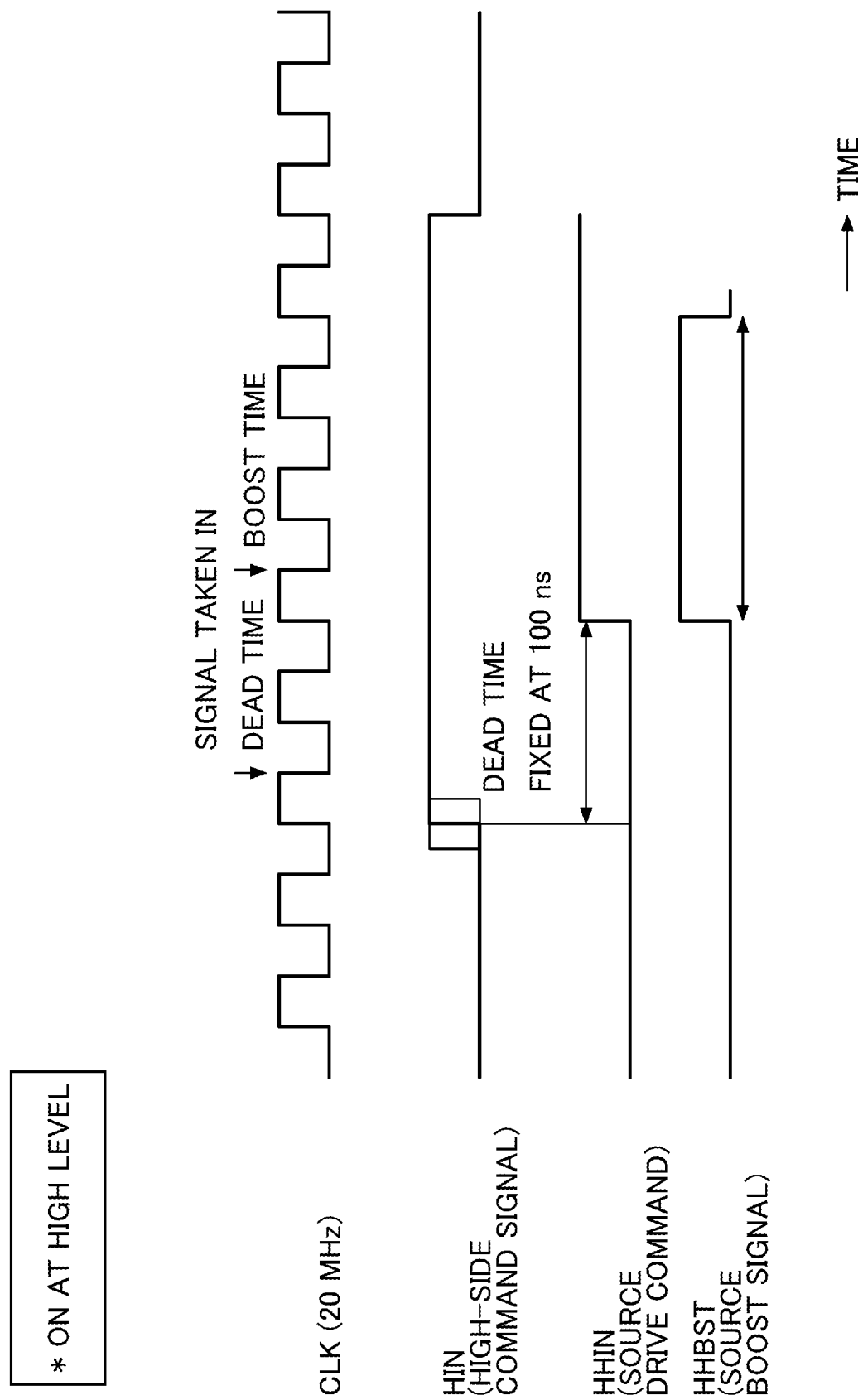
FIG. 11 is a timing chart assuming a behavior in which each control signal switches in sync with the rise of a clock CLK.

FIG. 11 is a timing chart assuming a behavior in which control signals switch in sync with the rise of the clock CLK. The counters 35, 36, and 37 take in each control signal at the falling edge of the clock CLK. As a result of this, no matter whether the high-side command signal HIN is delayed in the positive or negative direction with respect to the clock CLK due to wiring delay, the point where the dead time ends does not change as long as the delay is within half the cycle of the clock CLK. Therefore, the variation of the dead time becomes substantially equal to the wiring delay of the clock CLK and the control signals. Also, since the end of the dead time varies in sync with the clock CLK, the subsequent boost period time becomes just as accurate as the clock CLK. For example, if a dead time is generated by an analog delay circuit, the rise of the drive command HHIN and the clock CLK do not synchronize with each other, and so an error of ±½ CLK (an error half the cycle of the clock CLK) is produced at the maximum.

In FIG. 8, the logic circuit 31 may have a dead time generation circuit 10 that, when a test signal TST is input, generates the drive command HHIN and the drive command HLIN by using the high-side command signal HIN or the low-side command signal LIN, without using the clock CLK. By this means, the drive circuit 101 can operate even when there is no supply of clock CLK from outside the drive circuit 101. Also, the disappearance of clock CLK-induced noise brings about an effect of improving electro-magnetic interference (EMI).

The test signal TST is a signal that causes the operation mode of the drive circuit 101 to transition to a test mode, in which the dead time generation circuit 10 generates the drive command HHIN and the drive command HLIN without using the clock CLK. When the input of the test signal TST ceases, the operation mode of the drive circuit 101 is changed to a mode in which the drive command HHIN and the drive command HLIN are generated by using the clock CLK, as described hereinabove.

Figure 12:
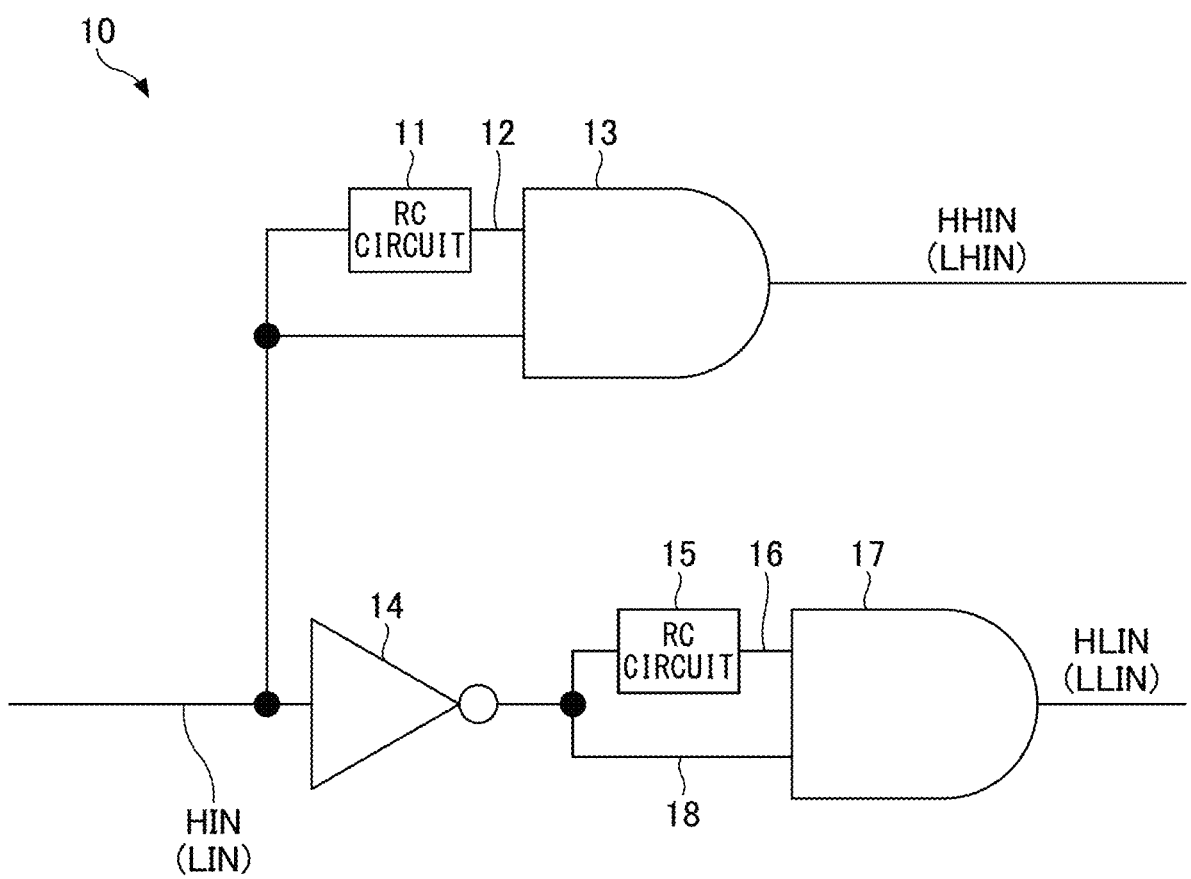
FIG. 12 is a diagram that shows an example structure of a dead time generation circuit.

FIG. 12 is a diagram that shows an example structure of the dead time generation circuit. The dead time generation circuit 10 generates the drive command HHIN and the drive command HLIN from the high-side command signal HIN, which is a pulse-width modulation signal. A dead time generation circuit that generates a drive command LHIN and a drive command LLIN from the low-side command signal LIN, which is a pulse-width modulation signal, may also be structured the same as the dead time generation circuit 10 shown in FIG. 12.

The dead time generation circuit 10 includes analog delay circuits 11 and 15, AND circuits 13 and 17, and an inversion circuit 14. The analog delay circuit 11 delays the high-side command signal HIN and generates a delayed signal 12. The AND circuit 13 outputs the logical conjunction of the high-side command signal HIN and the delayed signal 12 (delayed high-side command signal HIN) as a drive command HHIN. The inversion circuit 14 inverts the level of the high-side command signal HIN to generate an inverted signal 18. The analog delay circuit 15 delays the inverted signal 18 and generates a delayed inverted signal 16. The AND circuit 17 outputs the logical conjunction of the inverted signal 18 (inverted high-side command signal HIN) and the delayed inverted signal 16 (inverted and delayed high-side command signal HIN) as a drive command HLIN. Structured thus, the dead time generation circuit 10 can generate the drive command HHIN and the drive command HLIN such that the dead times $T_{hdtr}$ and $T_{hdtf}$ (FIG. 9 and FIG. 10) are produced without using the clock CLK.

The analog delay circuit 11 may attenuate and delay the high-side command signal HIN, which is a pulse-width modulation signal, through a first RC circuit. The analog delay circuit 15 may attenuate and delay the inverted signal 18 (inverted high-side command signal HIN), which is a pulse-width modulation signal, through a second RC circuit. Each RC circuit attenuates the input signal (the high-side command signal HIN or the inverted signal 18) by using a resistor R and a capacitor C. The analog delay circuit 11 delays the high-side command signal HIN by a time determined by the RC time constant of the first RC by shaping the waveform the circuit, of signal (attenuated input signal) output from the first RC circuit. The analog delay circuit 15 delays the inverted signal 18 by a time determined by the RC time constant of the second RC circuit, by shaping the waveform of the signal (attenuated input signal) output from the second RC circuit.

If there is no clock CLK, the counter 37 that counts the dead times stops, and so the current source cannot start outputting current. However, by setting the circuit's operation mode to test mode, the current source can start outputting current even without the clock CLK.

In FIG. 8, the high-side control circuit 32 has a first test circuit 21. When the dead time generation circuit 10 receives a test signal TST2 as input, the dead time generation circuit 10 generates the dead time $T_{hdtr}$ without using the clock CLK. When the input of the clock CLK ceases, the first test circuit 21 stops the counter 35 and extends the boost period. By this means, the high-side control circuit 32 outputs the source boost signal HHBST for the same period as for the drive command HHIN. Therefore, an inspection device (not shown) can secure a long period of time for measuring the high-level source current Ip (the sum of the first source current Ia1 and the second source current Ib1), and reduce the errors in detection of anomalies with the high-level source current Ip.

In FIG. 8, the high-side control circuit 32 has a second test circuit 22. When the dead time generation circuit 10 receives a test signal TST2 as input, the dead time generation circuit 10 generates the dead time $T_{hdtf}$ without using the clock CLK. When the input of the clock CLK ceases, the second test circuit 22 stops the counter 36 and extends the boost period. By this means, the high-side control circuit 32 outputs the sink boost signal HLBST for the same period as for the drive command HLIN. Therefore, the inspection device (not shown) can secure a long period of time for measuring the high-level sink current Ip (the sum of the first sink current Ia2 and the second sink current Ib2), and reduce the errors in detection of anomalies with the high-level sink current Ip.

When the dead time generation circuit 10 receives a test signal TST2 as input, the dead time generation circuit 10 generates the dead time $T_{hdtr}$ without using the clock CLK. When the input of the clock CLK ceases, the first test circuit 21 stops the counter 35 and extends the boost period. At this time, given that the boost current is set to 0 mA (disabled) or the boost period is set to 0 seconds by the setting signal TST1, the first test circuit 21 stops the operation of the second source current source 42 such that the flow of the second source current Ib1 stops. The first test circuit 21 operates the first source current source 41 based on the same signal as the drive command HHIN generated by the logic circuit 31 without using the clock CLK.

When the flow of the second source current Ib1 stops, the second source current Ib1 is not added to the first source current Ia1, and thus only the first source current Ia1 flows to the drive terminal OUTM as the source current. Therefore, the inspection device (not shown) can secure a long period of time for measuring the first source current Ia1, and reduce the errors in detection of anomalies with the first source current Ia1.

When the dead time generation circuit 10 receives the test signal TST2 as input, the dead time generation circuit 10 generates the dead time $T_{hdtf}$ without using the clock CLK. When the input of the clock CLK ceases, the second test circuit 22 stops the counter 36 and extends the boost period. At this time, given that the boost current is set to 0 mA (disabled) or the boost period is set to 0 seconds by the setting signal TST1, the first test circuit 21 stops the operation of the second sink current source 52 such that the flow of the second sink current Ib2 stops. The second test circuit 22 operates the first sink current source 51 based on the same signal as the drive command HLIN generated by the logic circuit 31 without using the clock CLK.

When the flow of the second sink current Ib2 stops, the second sink current Ib2 is not added to the first sink current Ia2, and thus only the first sink current Ia2 flows to the drive terminal OUTM as the sink current. Therefore, the inspection device (not shown) can secure a long period of time for measuring the first sink current Ia2 in the first test mode, and reduce the errors in detection of anomalies with the first sink current Ia2.

Figure 13:
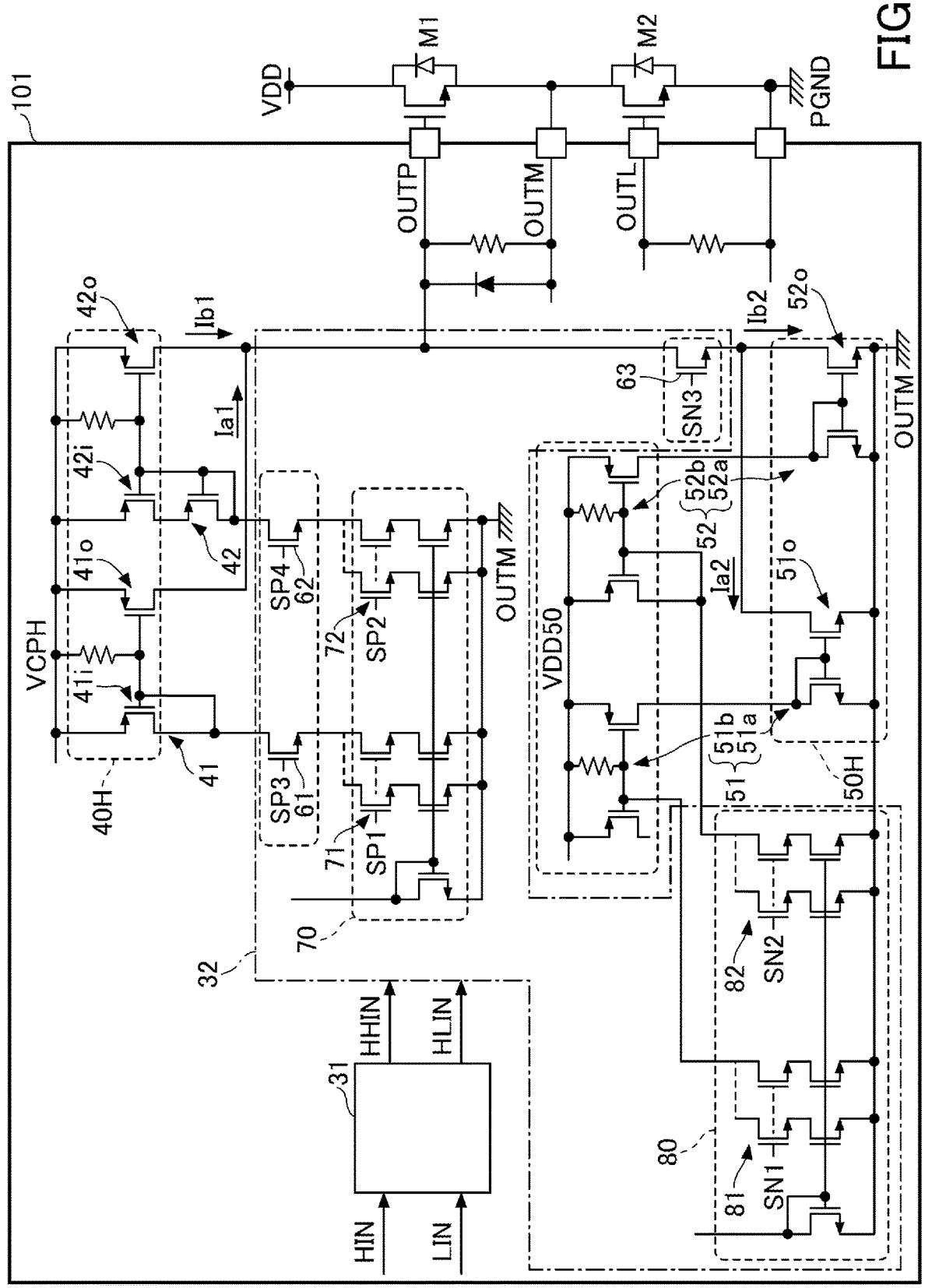
FIG. 13 is a diagram that shows a more specific example structure of a drive circuit according to one embodiment, in which a high-level current and a low-level current are generated from multiple current sources.

FIG. 13 is a diagram that shows a more specific example structure of a drive circuit according to one embodiment, in which a high-level current and a low-level current are generated from multiple current sources. FIG. 13 shows a specific example of the structure shown in FIG. 8 (including the high-side control circuit 32, the source current source 40H, and the sink current source 50H). The specific example of the high-side drive circuit shown in FIG. 13 can be applied to the low-side drive circuit as well.

The high-side control circuit 32 includes a first control transistor 61 that controls whether or not to output the first source current Ia1, and a second control transistor 62 that controls whether or not to output the second source current Ib1. The first source current source 41 includes a first output transistor 410 that outputs the first source current Ia1, and a first input transistor 41i to which a first control transistor 61 is connected. The second source current source 42 includes a second output transistor 420 that outputs the second source current Ib1, and a second input transistor 42i to which a second control transistor 62 is connected.

According to this structure, when a signal SP3 is asserted and the first control transistor 61 is turned on, the high-side control circuit 32 can output the first source current Ia1 from the first output transistor 410. On the other hand, when a signal SP3 is negated and the first control transistor 61 is turned off, the high-side control circuit 32 can stop the output of the first source current Ia1 from the first output transistor 410. Similarly, when a signal SP4 is asserted and the second control transistor 62 is turned on, the high-side control circuit 32 can output the second source current Ib1 from the second output transistor 420. On the other hand, when a signal SP4 is negated and the second control transistor 62 is turned off, the high-side control circuit 32 can stop the output of the second source current Ib1 from the second output transistor 420.

In the illustrated example, the first control transistor 61 and the second control transistor are N-channel MOSFETs. The first output transistor 410, the first input transistor 41i, the second output transistor 420, and the second input transistor 42i are P-channel MOSFETs. The first output transistor 410 and the first input transistor 41i form a PMOS first source current mirror that generates the first source current Ia1. The second output transistor 420 and the second input transistor 42i form a PMOS second source current mirror that generates the second source current Ib1.

The high-side control circuit 32 includes a third control transistor 63 that controls whether or not to output the first sink current Ia2 and the second sink current Ib2. The first sink current source 51 includes an NMOS first sink current mirror 51a and a PMOS third source current mirror 51b between the middle terminal OUTM and the power source node of the power source voltage VDD 50. The power source voltage VDD 50 is a voltage that is lower than a power source voltage VCPH. The second sink current source 52 includes an NMOS second sink current mirror 52a and a PMOS fourth source current mirror 52b between the middle terminal OUTM and the power source node of the power source voltage VDD 50. The first sink current mirror 51a of the first sink current source 51 includes a third output transistor 510 in which the first sink current Ia2 flows through the drive terminal OUTP via the third control transistor 63. The second sink current mirror 52a of the second sink current source 52 includes a fourth output transistor 520 in which the second sink current Ib2 flows through the drive terminal OUTP via the third control transistor 63.

According to this structure, when the high-side control circuit 32 asserts the signal SN3 and turns on the third control transistor 63, the high-side control circuit 32 can output the first sink current Ia2 from the third output transistor 510, and output the second sink current Ib2 from the fourth output transistor 520. On the other hand, when the high-side control circuit 32 negates the signal SN3 and turns off the third control transistor 63, the high-side control circuit 32 can stop the output of the first sink current Ia2 from the third output transistor 510 and the output of the second sink current Ib2 from the fourth output transistor 520.

In the illustrated example, the third control transistor is an N-channel MOSFET. The third output transistor 510 and the fourth output transistor 520 are N-channel MOSFETs.

The third control transistor 63 may be formed with elements having higher voltage resistance than the first sink current source 51 and the second sink current source 52. For example, the third control transistor 63 is formed with elements having higher voltage resistance than the third output transistor 510 and the fourth output transistor 520. By this means, the area of the current sink circuit that generates the first sink current Ia2 and the second sink current Ib2 can be reduced, and the accuracy of the first sink current Ia2 and the second sink current Ib2 improves.

When a current mirror is formed by using a high voltage resistance MOSFET, the area of the current mirror may be made larger in order to improve the accuracy of sink currents. On the other hand, when using a high voltage resistance MOSFET as a switch, the gate voltage can be set high, so that the area of the switch is no larger than a current mirror. Therefore, by forming a current mirror using a MOSFET with standard voltage resistance, the area of the current sink circuit can be reduced and the accuracy of sink currents can be improved, compared to when forming a current mirror by using a high voltage resistance MOSFET.

The high-side control circuit 32 may include a source current setting circuit 70 that switches the magnitude of source currents generated by the source current source 40H. The source current setting circuit 70 includes at least one of a first source current setting circuit 71 that switches the magnitude of the first source current Ia1 and a second source current setting circuit 72 that switches the magnitude of the second source current Ib1. In the illustrated example, the first source current setting circuit 71 is connected between the first control transistor 61 and the middle terminal OUTM. The second source current setting circuit 72 is connected between the second control transistor 62 and the middle terminal OUTM. The first source current setting circuit 71 includes a control switch that switches the magnitude of the output current of a current mirror in accordance with the signal SP3. The second source current setting circuit 72 includes a control switch that switches the magnitude of the output current of a current mirror in accordance with the signal SP2.

The high-side control circuit 32 may include a sink current setting circuit 80 that switches the magnitude of the sink current generated by the sink current source 50H. The sink current setting circuit 80 includes at least one of a first sink current setting circuit 81 that switches the magnitude of the first sink current Ia2, and a second sink current setting circuit 82 that switches the magnitude of the second sink current Ib2. In the illustrated example, the first sink current setting circuit 81 is connected between the third source current mirror 51b of the first sink current source 51 and the middle terminal OUTM. The second sink current setting circuit 82 is connected between the fourth source current mirror 52b of the second sink current source 52 and the middle terminal OUTM. The first sink current setting circuit 81 includes a control switch that switches the magnitude of the output current of the current mirror in accordance with the signal SN1. The second sink current setting circuit 82 includes a control switch that switches the magnitude of the output current of the current mirror in accordance with the signal SN2.

Figure 14:
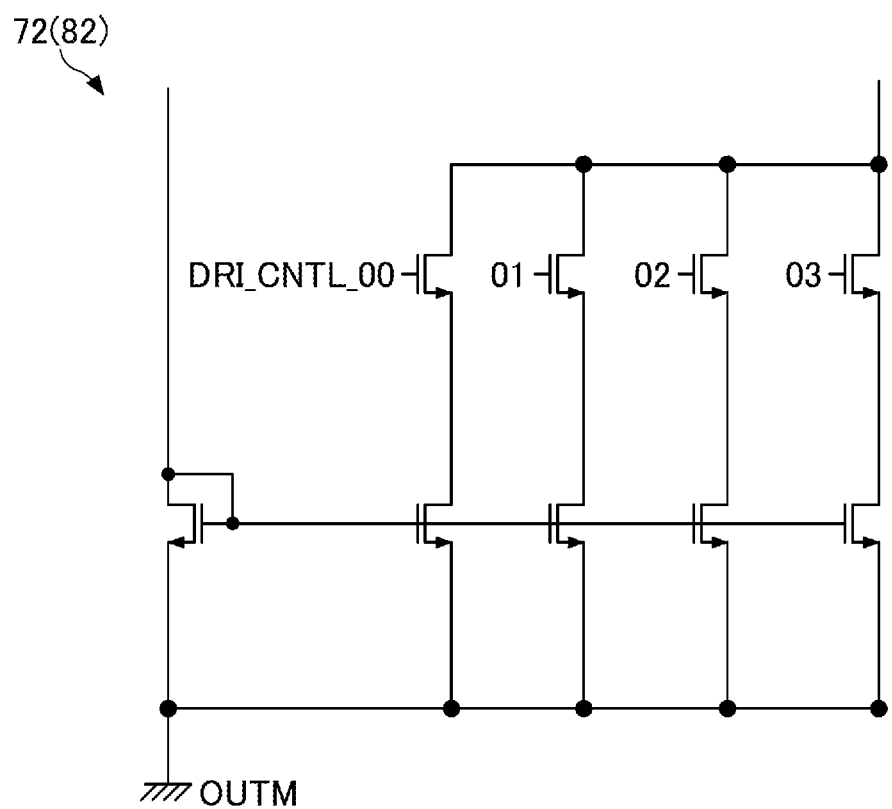
FIG. 14 is a diagram that shows a specific example of a current setting circuit.

FIG. 14 is a diagram that shows a specific example of the current setting circuit. FIG. 14 shows an example structure of a second source current setting circuit 72 that switches the magnitude of the second source current Ib1 or a second sink current setting circuit 82 that switches the magnitude of the second sink current Ib2. The setting signal DRI_CNTR_ corresponds to the signal SP2 or the signal SN2 in FIG. 13. In this example, "" may be four types: "00," "01," "02," and "03." The basic structures of the first source current setting circuit 71 and the first sink current setting circuit 81 may be the same as in FIG. 14. The number of parallel FETs varies depending on the number of patterns of current switching.

FIG. 15 is a diagram that shows an example of a table that stores the setting signals, DRI_CNTL_** for setting the magnitude of the boost current Ib by the current setting circuit shown in FIG. 14. The number of setting signals and the current value set by each setting signal are simply examples. Such a table is stored in a memory in the drive circuit 101.

The second source current setting circuit 72 switches the magnitude of the second source current Ib1 by turning on or off multiple control switches (FIG. 14) connected in parallel, in accordance with the setting signal DRI_CNTR_. The second sink current setting circuit 82 switches the magnitude of the second sink current Ib2 by turning on or off multiple control switches (FIG. 14) connected in parallel, in accordance with the setting signal DRI_CNTR_.

FIG. 16 is a timing chart that shows an example of the operation of the drive circuit shown in FIG. 13. FIG. 16 is a timing chart of the high-side drive circuit. The timing chart shown in FIG. 16 can be applied to the operation of the low-side drive circuit as well. FIG. 16 will be described with reference to FIG. 13.

When the drive command HHIN is an ON command, the high-side control circuit 32 asserts the signal SP1 and the signal SP3, and the first source current Ia1 starts flowing through the drive terminal OUTP. When the drive command HHIN is an OFF command, the high-side control circuit 32 negates the signal SP1 and the signal SP3, and the first source current Ia1 stops flowing through the drive terminal OUTP. On the other hand, when the drive command HHIN switches from an OFF command to an ON command, the high-side control circuit 32 asserts the signal SP2 and the signal SP4, and the second source current Ib1 starts flowing through the drive terminal OUTP. The high-side control circuit 32 applies the first source current Ia1 and the second source current Ib1, and then negates the signal SP2 and signal SP4 in accordance with the conditions exemplified above, thereby stopping the flow of the second source current Ib1. After the high-side control circuit 32 stops the flow of the second source current Ib1, the high-side control circuit 32 negates the signal SP1 and signal SP3 when the drive command HHIN switches from an ON command to an OFF command, thereby stopping the flow of the first source current Ia1. Through this operation, the drive circuit 101 can shorten the time required to make a transition from the high-level source current Ip to the low-level source current Ia, and enable slew-rate control whereby the accuracy of the source current Ip and the source current Ia improve.

When the drive command HLIN is an ON command, the high-side control circuit 32 asserts the signal SN1 and the signal SN3, and draws in the first sink current Ia2 from the drive terminal OUTP. When the drive command HLIN is an OFF command, the high-side control circuit 32 asserts the signal SN1 and the signal SN3, and stops drawing in the first sink current Ia2 from the drive terminal OUTP. On the other hand, when the drive command HLIN switches from the OFF command to an ON command, the high-side control circuit 32 asserts the signals SN1, SN2, and SN3, and draws in the second sink current Ib2 from the drive terminal OUTP. That is, the high-side control circuit 32 applies the first sink current Ia2 and the second sink current Ib2 and then negates the signal SN2 in accordance with the conditions exemplified above, and stops drawing in the second sink current Ib2. When the drive command HLIN switches from an ON command to an OFF command after the high-side control circuit 32 stops drawing in the second sink current Ib2, the high-side control circuit 32 negates the signal SN1 and the signal SN3, and stops the flow of the first sink current Ia2. By means of this operation, the drive circuit 101 can shorten the time required to make a transition from the high-level sink current Ip to the low-level sink current Ia, and enable slew-rate control whereby the accuracy of the source current Ip and the source current Ia improves.

An embodiment of the present disclosure has been explained above. However, the above embodiment only presents an example, and the present invention is by no means limited to the above embodiment. The above embodiment can be implemented in various other forms, and various combinations, omissions, substitutions, changes, and so forth can be made without departing from the spirit of the present invention. Embodiments with such changes and their modifications are included within the scope and gist of the invention, and are included within the scope of the invention recited in the claims and its equivalents.

What is claimed is:

1. A drive circuit comprising:
   a drive terminal;
   a first source current source configured to generate a first source current that flows through the drive terminal;
   a second source current source configured to generate a second source current that is added to the first source current;
   a first sink current source configured to generate a first sink current that flows through the drive terminal;
   a second sink current source configured to generate a second sink current that is added to the first sink current;
   a logic circuit configured to generate a source drive command for operating the first source current source and a sink drive command for operating the first sink current source, in accordance with a clock, such that the first source current and the first sink current flow alternately, with dead times in between, each dead time being a period in which flows of the first source current and the first sink current are stopped; and
   a control circuit configured to generate a source boost signal and a sink boost signal in accordance with the clock,
   the source boost signal operating the second source current source such that the second source current starts flowing through the drive terminal immediately after a first one of the dead times ends, and then stops flowing, and
   the sink boost signal operating the second sink current source such that the second sink current starts flowing through the drive terminal immediately after a second one of the dead times ends, and then stops flowing.

2. The drive circuit according to claim 1,
   wherein the logic circuit includes an analog delay circuit that is configured to delay a pulse-width modulation signal, and
   wherein, when a test signal is input, the logic circuit generates the dead times by using the analog delay circuit, without using the clock.

3. The drive circuit according to claim 2, wherein, when the test signal is input and the clock is stopped, the control circuit outputs the source boost signal for a same period as for the source drive command, and outputs the sink boost signal for a same period as for the sink drive command.

4. The drive circuit according to claim 2, wherein the analog delay circuit delays the pulse-width modulation signal through an RC circuit.

5. A drive circuit comprising:
   a drive terminal;
   a first source current source configured to generate a first source current that flows through the drive terminal;
   a second source current source configured to generate a second source current that is added to the first source current;
   a first sink current source configured to generate a first sink current that flows through the drive terminal;
   a second sink current source configured to generate a second sink current that is added to the first sink current; and
   a control circuit configured such that:
      when a source drive command becomes an ON command, the first source current and the second source current start flowing through the drive terminal, and then a flow of the second source current is stopped;
      when the source drive command becomes an OFF command, a flow of the first source current is stopped;
      when a sink drive command becomes the ON command, the first sink current and the second sink current start flowing through the drive terminal, and then a flow of the second sink current is stopped; and
      when the sink drive command becomes the OFF command, a flow of the first sink current is stopped,
   wherein the control circuit generates a first dead time, a second dead time, a first boost period, and a second boost period, in accordance with a common clock,
      the first dead time being a period from when the sink drive command becomes the OFF command, until the source drive command becomes the ON command,
      the second dead time being a period from when the source drive command becomes the OFF command, until the sink drive command becomes the ON command,
      the first boost period being a period in which the second source current is added to the first source current, and
      the second boost period being a period in which the second sink current is added to the first sink current.

6. The drive circuit according to claim 1, wherein the source drive command and the sink drive command are generated in accordance with command signals that change in sync with the clock.

7. The drive circuit according to claim 1,
wherein the control circuit includes a first control transistor configured to control whether or not to output the first source current, and a second control transistor configured to control whether or not to output the second source current,
wherein the first source current source includes a first output transistor that outputs the first source current, and a first input transistor to which the first control transistor is connected, and
wherein the second source current source includes a second output transistor that outputs the second source current, and a second input transistor to which the second control transistor is connected.

8. The drive circuit according to claim 7,
wherein the control circuit includes a third control transistor configured to control whether or not to output the first sink current and the second sink current,
wherein the first sink current source includes a third output transistor configured such that the first sink current flows through the drive terminal via the third control transistor, and
wherein the second sink current source includes a fourth output transistor configured such that the second sink current flows through the drive terminal via the third control transistor.

9. The drive circuit according to claim 8, wherein the third control transistor has higher voltage resistance than the third output transistor and the fourth output transistor.

* * * * *